(12) United States Patent
Lee et al.

(10) Patent No.: US 11,742,248 B2
(45) Date of Patent: Aug. 29, 2023

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Pei-Wei Lee, Pingtung County (TW); Tsung-Yu Hung, Hsinchu (TW); Pang-Yen Tsai, Hsinchu County (TW); Yasutoshi Okuno, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 225 days.

(21) Appl. No.: 17/098,267

(22) Filed: Nov. 13, 2020

(65) Prior Publication Data

US 2021/0082773 A1  Mar. 18, 2021

Related U.S. Application Data

(62) Division of application No. 16/255,668, filed on Jan. 23, 2019, now Pat. No. 10,840,152.

(Continued)

(51) Int. Cl.
*H01L 21/8238* (2006.01)
*H01L 27/092* (2006.01)
(Continued)

(52) U.S. Cl.
CPC .......... *H01L 21/823821* (2013.01); *H01L 21/02436* (2013.01); *H01L 21/02532* (2013.01);
(Continued)

(58) Field of Classification Search
CPC ....... H01L 21/823821; H01L 21/02436; H01L 21/02532; H01L 21/02661; H01L 21/823807; H01L 27/0924; H01L 29/1083; H01L 21/0262; H01L 21/02639; H01L 21/31111; H01L 21/823878; H01L 29/66795

See application file for complete search history.

(56) References Cited

U.S. PATENT DOCUMENTS 6,255,180 B1    7/2001  Smith
8,377,783 B2 *  2/2013  Shifren ............... H01L 27/0921
                                                    257/376
(Continued)

*Primary Examiner* — Yasser A Abdelaziez
(74) *Attorney, Agent, or Firm* — Maschoff Brennan

(57) ABSTRACT

A method includes etching a hybrid substrate to form a recess in the hybrid substrate, in which the hybrid substrate includes a first semiconductor layer, a dielectric layer over the first semiconductor layer, and a second semiconductor layer over the first semiconductor layer, in which after the etching, a top surface of the first semiconductor layer is exposed to the recess; forming a spacer on a sidewall of the recess, in which the spacer is slanted at a first angle relative to a top surface of the first semiconductor layer; reshaping the spacer such that the a first sidewall of the reshaped spacer is slanted at a second angle relative to the top surface of the first semiconductor layer, in which the second angle is greater than the first angle; and performing a first epitaxy process to grow an epitaxy semiconductor layer in the recess after reshaping the spacer.

20 Claims, 29 Drawing Sheets

Related U.S. Application Data

(60) Provisional application No. 62/737,865, filed on Sep. 27, 2018.

(51) Int. Cl.
*H01L 29/10* (2006.01)
*H01L 21/02* (2006.01)

(52) U.S. Cl.
CPC .............. *H01L 21/02661* (2013.01); *H01L 21/823807* (2013.01); *H01L 27/0924* (2013.01); *H01L 29/1083* (2013.01)

(56) References Cited

U.S. PATENT DOCUMENTS

| | | | |
|---|---|---|---|
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,514 B2 * | 12/2015 | Hong | H01L 29/7848 |
| 9,214,555 B2 | 12/2015 | Oxland et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,303 B2 | 1/2017 | Lee et al. | |
| 9,548,366 B1 | 1/2017 | Ho et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,716,222 B1 | 7/2017 | Chuang | |
| 9,831,183 B2 | 11/2017 | Lin et al. | |
| 9,859,386 B2 | 1/2018 | Ho et al. | |
| 10,164,096 B2 | 12/2018 | Li | |
| 10,522,682 B2 | 12/2019 | Yoon | |
| 2004/0241460 A1 * | 12/2004 | Bedell | H01L 21/76267 438/479 |
| 2007/0269963 A1 * | 11/2007 | Cheng | H01L 29/045 438/479 |
| 2012/0080722 A1 * | 4/2012 | Yin | H01L 29/1054 257/192 |
| 2013/0221412 A1 * | 8/2013 | Bian | H01L 29/045 438/150 |
| 2013/0228862 A1 | 9/2013 | Lee | |
| 2016/0247919 A1 | 8/2016 | Akarvardar | |
| 2016/0379894 A1 * | 12/2016 | Hashemi | H01L 21/30608 438/427 |
| 2019/0006391 A1 | 1/2019 | Shen | |

* cited by examiner

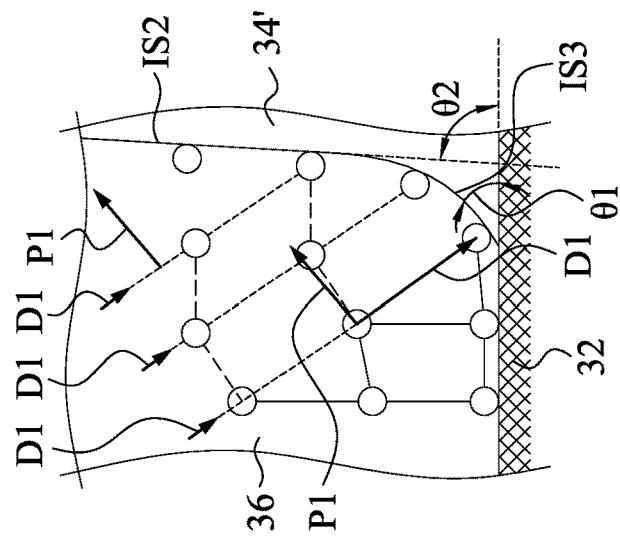
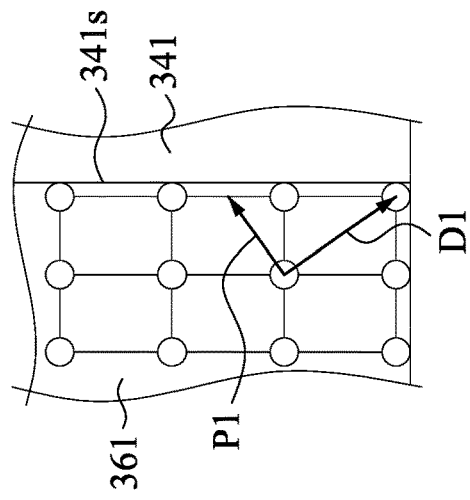
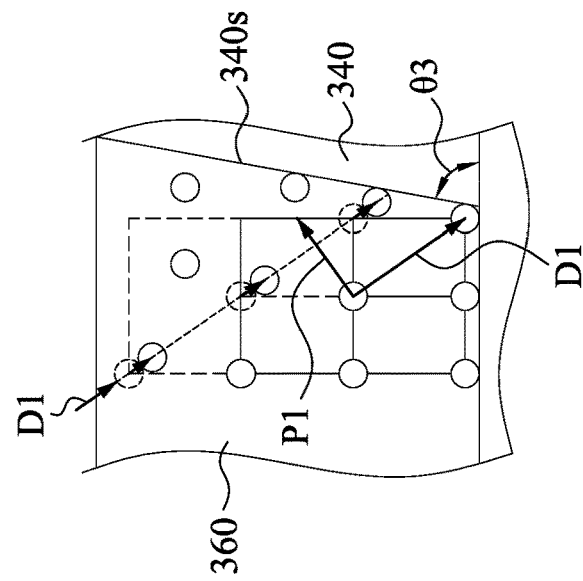
Fig. 10C
Fig. 10B
Fig. 10A

SEMICONDUCTOR DEVICE AND MANUFACTURING METHOD THEREOF

PRIORITY CLAIM AND CROSS-REFERENCE

This application is a Divisional Application of U.S. application Ser. No. 16/255,668, filed Jan. 23, 2019, now U.S. Pat. No. 10,840,152, issued on Nov. 17, 2020, which claims priority to U.S. Provisional Patent Application Ser. No. 62/737,865, filed Sep. 27, 2018, all of which are herein incorporated by reference in their entireties.

BACKGROUND

With the increasing down-scaling of integrated circuits and increasingly demanding requirements to the speed of integrated circuits, transistors need to have higher drive currents with increasingly smaller dimensions. Fin Field-Effect Transistors (FinFETs) were thus developed. In conventional FinFET formation processes, the semiconductor fins may be formed by forming trenches in a silicon substrate, filling the trenches with dielectric materials to form Shallow Trench Isolation (STI) regions, and then recessing the top portions of the STI regions. The silicon substrate portions between the recessed portions of the STI regions thus form semiconductor fins, on which the FinFETs are formed.

BRIEF DESCRIPTION OF THE DRAWINGS

Aspects of the present disclosure are best understood from the following detailed description when read with the accompanying drawings. It is noted that, in accordance with the standard practice in the industry, various features are not drawn to scale. In fact, the dimensions of the various features may be arbitrarily increased or reduced for clarity of discussion.

FIGS. 1 through 10C illustrate the cross-sectional views and perspective views of intermediate stages in the formation of Fin Field-Effect Transistors (FinFETs) in accordance with some embodiments.

DETAILED DESCRIPTION

Figure 1:
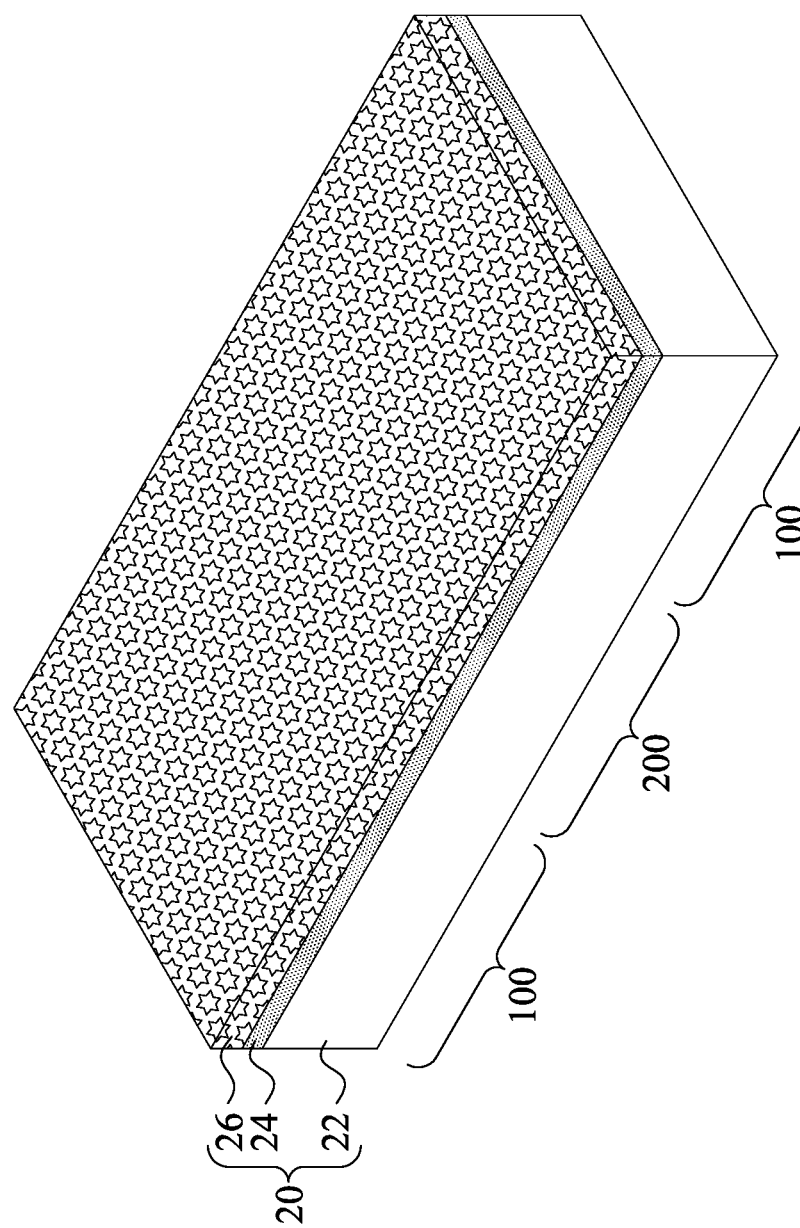

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming Fin Field-Effect Transistors (FinFETs) on a hybrid substrate and the resulting structures are provided in accordance with various exemplary embodiments. The intermediate stages of forming the hybrid substrate and the FinFETs are illustrated in accordance with some embodiments. Some variations of some embodiments are discussed. Throughout the various views and illustrative embodiments, like reference numbers are used to designate like elements.

FIGS. 1 through 10C and FIGS. 12 through 22 illustrate the cross-sectional views and perspective views of intermediate stages in the formation of the hybrid substrate and the FinFETs in accordance with some embodiments of the present disclosure.

Referring to FIG. 1, a hybrid substrate 20 is provided. The hybrid substrate 20 includes a crystalline silicon layer 22, a dielectric layer 24 over the silicon layer 22, and a crystalline silicon layer 26 over the dielectric layer 24. The dielectric layer 24 may be formed of silicon oxide or other dielectric materials such as silicon nitride, silicon carbide, etc. The thickness of the dielectric layer 24 may be in the range between about 5 nm and about 15 nm, and different thicknesses may be adopted. One of ordinary skill in the art will realize that the dimensions recited throughout the description are merely examples, and may be changed to different values. The silicon layer 26 is bonded to the dielectric layer 24. The hybrid substrate 20 includes a first portion in an n-type device region 100, and a second portion in a p-type device region 200.

The silicon layer 22 is a (100) substrate having a (100) surface orientation, with the top surface of the silicon layer 22 in the (100) plane of silicon. In accordance with some embodiments, the silicon layer 26 is a (110) substrate having a (110) surface orientation, with the top surface of the silicon layer 26 in the (110) plane of silicon. In accordance with alternative embodiments of the present disclosure, the silicon layer 26 is a (100) R45 layer, which is formed by rotating a (100) substrate by 40-50 degrees before cutting and bonding to the dielectric layer 24. As a result, the top surface of the (100) R45 layer has a (100) R45 surface orientation, and the sidewalls of the resulting fins (discussed referring to FIG. 13) are also on the (100) plane of silicon.

Figure 2:
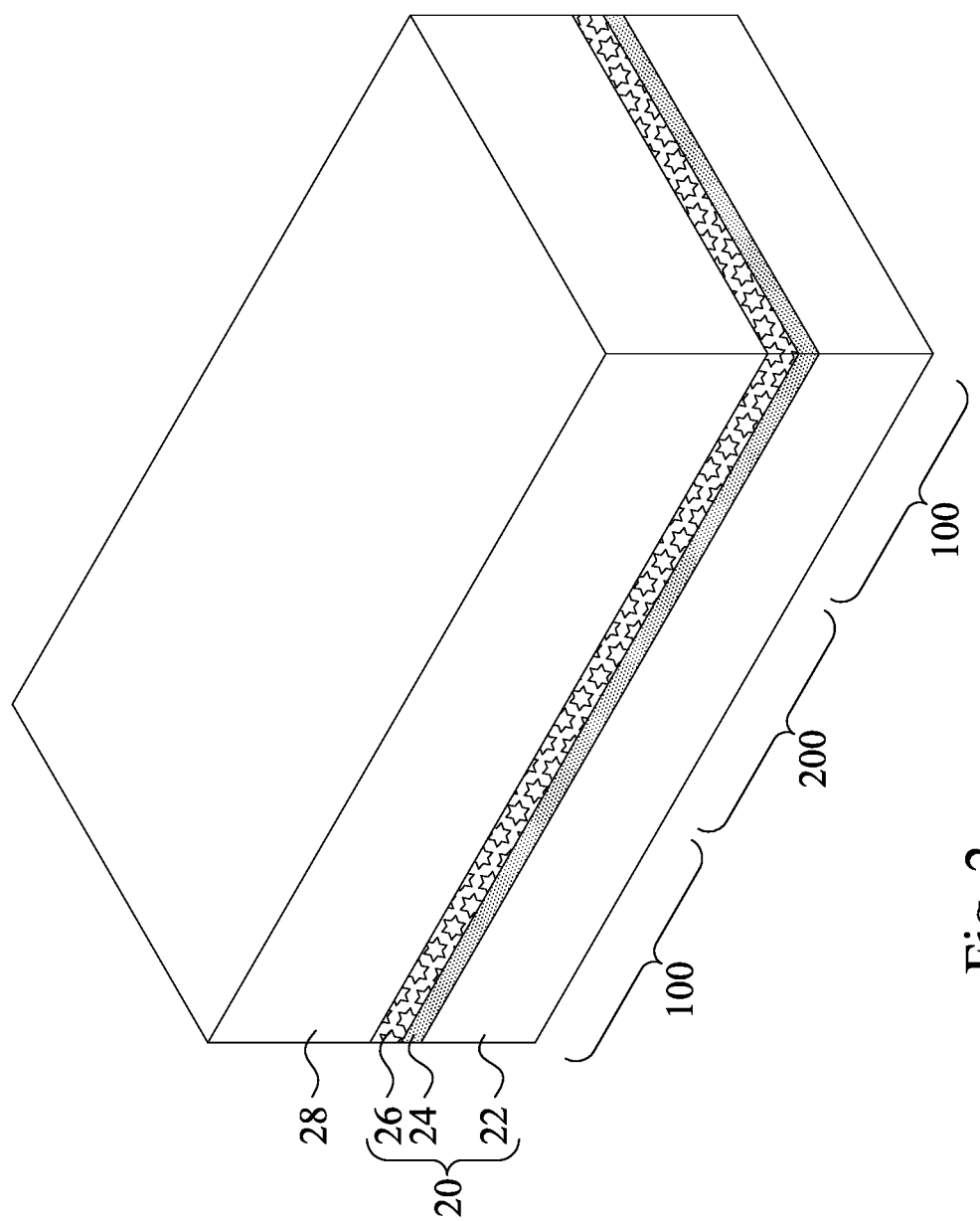

Referring to FIG. 2, an epitaxy is performed to grow a silicon layer 28 on the silicon layer 26. Depending on the orientation of the silicon layer 26, the silicon layer 28 may be a (110) layer with the top surface being on the (110) plane of silicon, or may be a (100) R45 layer. The silicon layer 28 may be free from germanium. Furthermore, the silicon layer 28 may be intrinsic, with no p-type and n-type impurity doped in the epitaxy. In accordance with alternative embodiments, the silicon layer 28 is in-situ doped with a p-type impurity during the epitaxy. The thickness of the silicon layer 28 may be close to the fin height of the resulting FinFETs.

Figure 3:
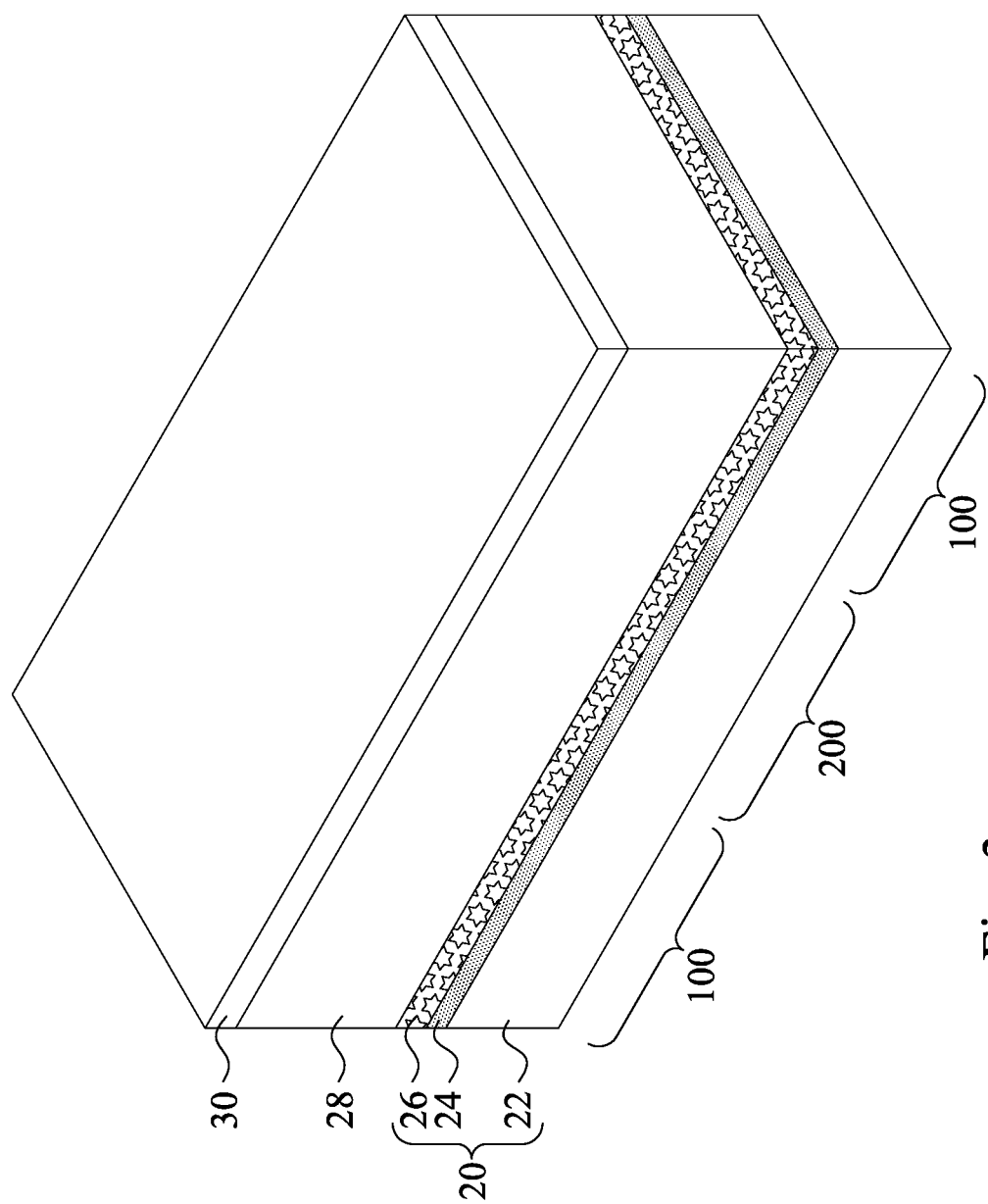

Reference is made to FIG. 3. A capping layer 30 is formed as a blanket planar layer over the silicon layer 28, for example, through thermal oxidation or deposition. The capping layer 30 may be formed of silicon oxide or other dielectric materials such as silicon nitride, silicon carbide, or silicon oxynitride.

Figure 4A:
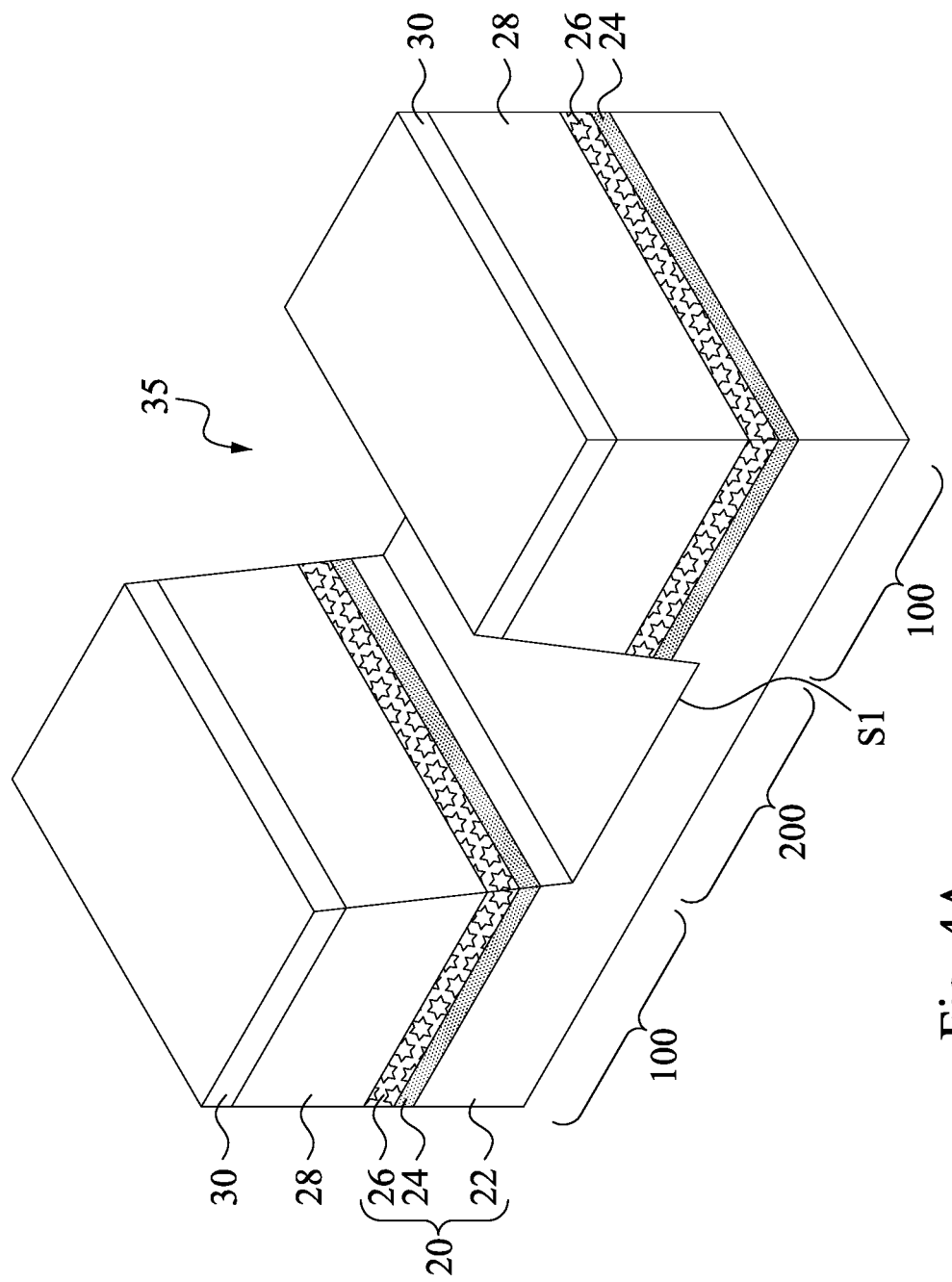
Figure 4B:
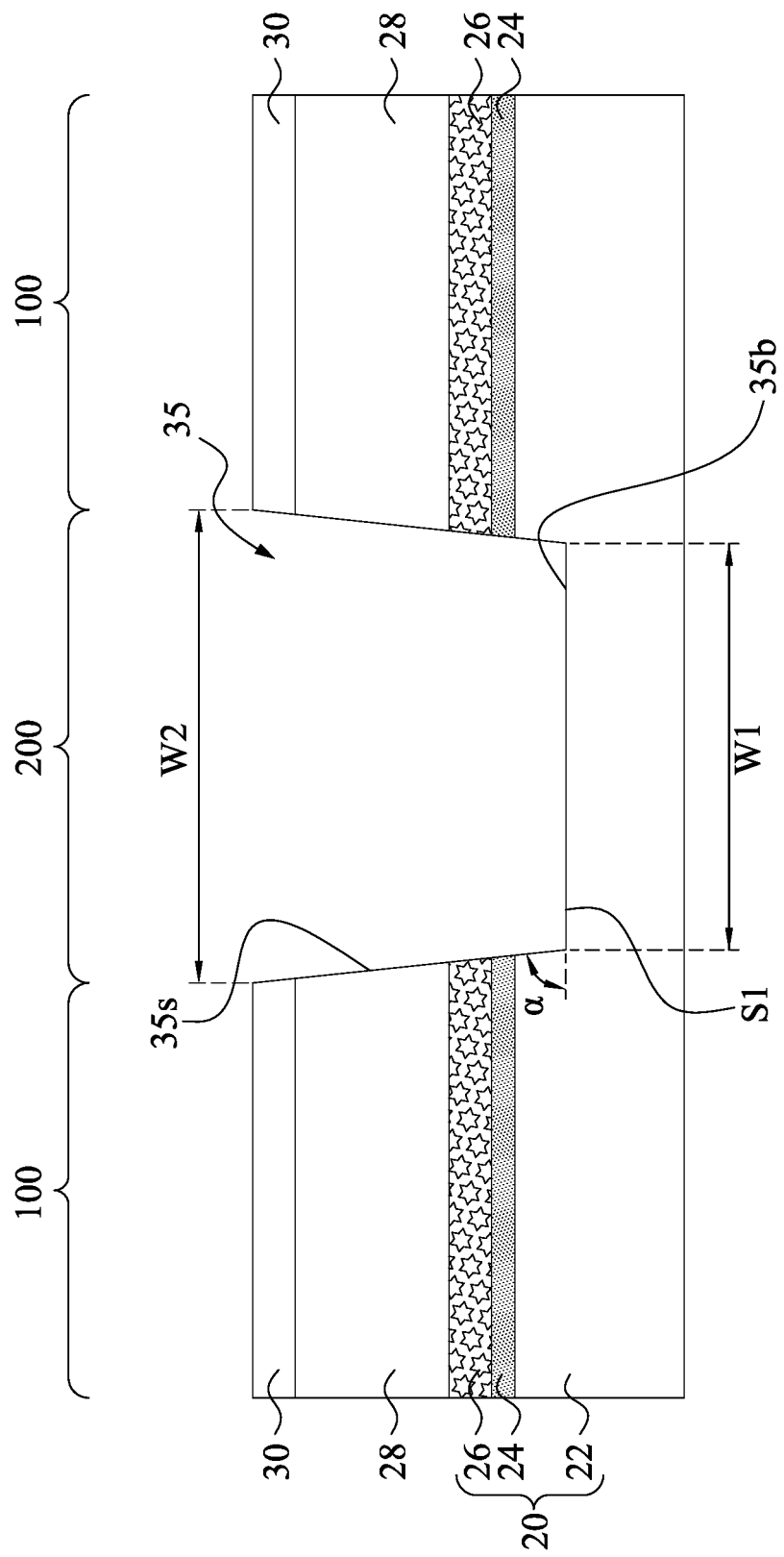

FIGS. 4A and 4B illustrate the recessing of the silicon layer 28 and the hybrid substrate 20 in the p-type device region 200, and the recessing is not performed in the n-type device region 100. Therefore, a recess 35 is formed in the p-type device region 200. During the recessing, the capping layer 30, the silicon layer 28, and the silicon layer 26 are etched-through, and the underlying silicon layer 22 is etched. A top surface S1 of the silicon layer 22, which has the (100) surface plane, is thus exposed to the recess 35. The recess 35 has a tapered profile. In other words, the recess 35 has a bottom width W1 and a top width W2 greater than the bottom width W1. The recess 35 has a bottom surface 35b and a sidewall 35s slanted relative to the bottom surface 35b at an acute angle α less than about 65 degrees, which in turn results in an unwanted slanted profile of a subsequently formed spacer.

In some embodiments, recessing the silicon layer 28 includes suitable lithography and etching techniques. For example, a resist layer (not shown) is formed over the capping layer 30. The resist layer can be any photoresist used in lithography processing. The resist is patterned to expose portions of the capping layer 30. Thereafter, an etching process is performed on the capping layer 30 and the silicon layer 28 to form the recess 35 using the patterned resist as an etch mask. The etching process includes, for example, a dry etch, a wet etch, or a combination of dry etch and wet etch. The etchant used in the dry etching process may include fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching process to gain etch selectivity, flexibility and desired etch profile.

Figure 5A:
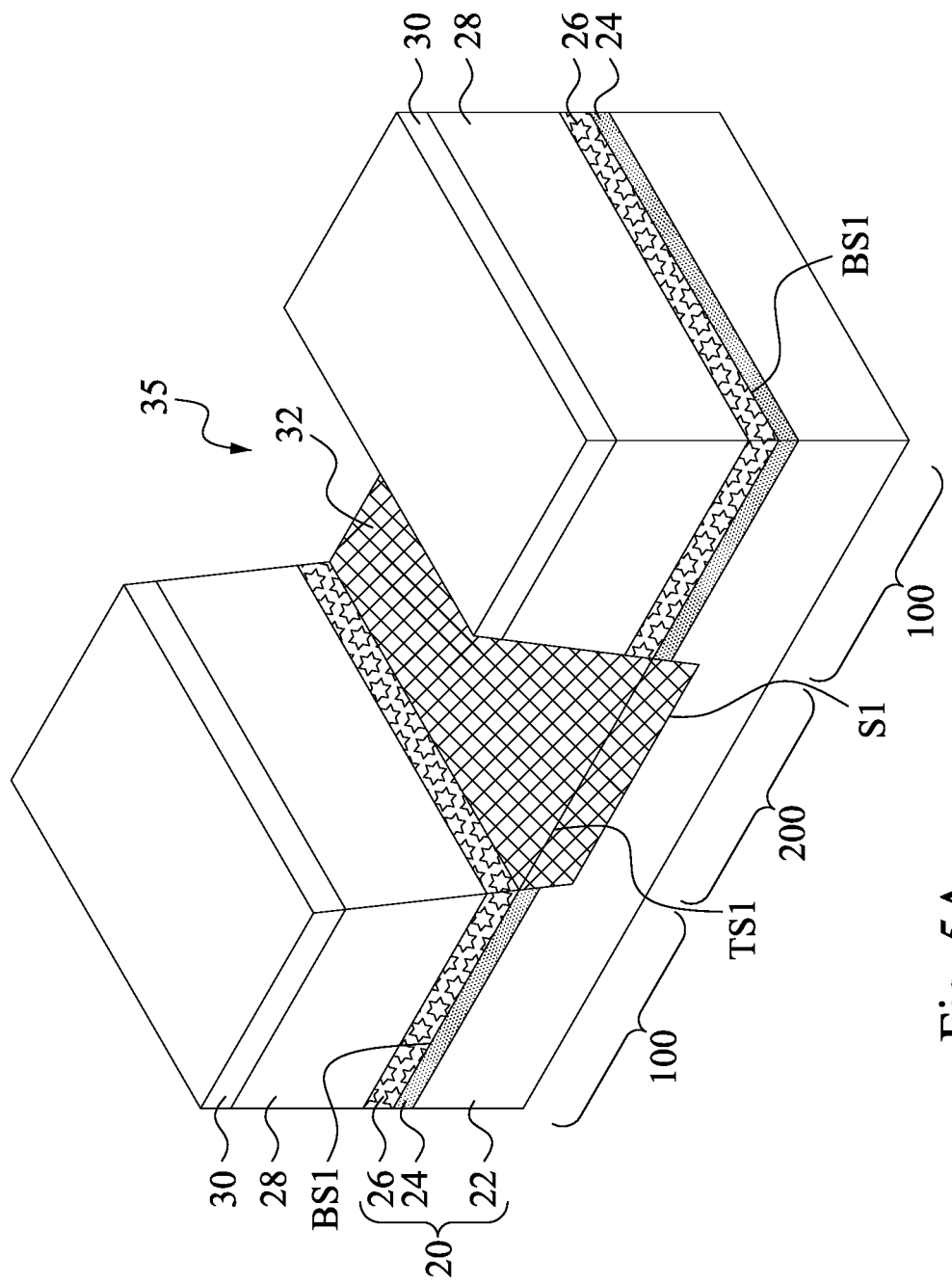
Figure 5B:
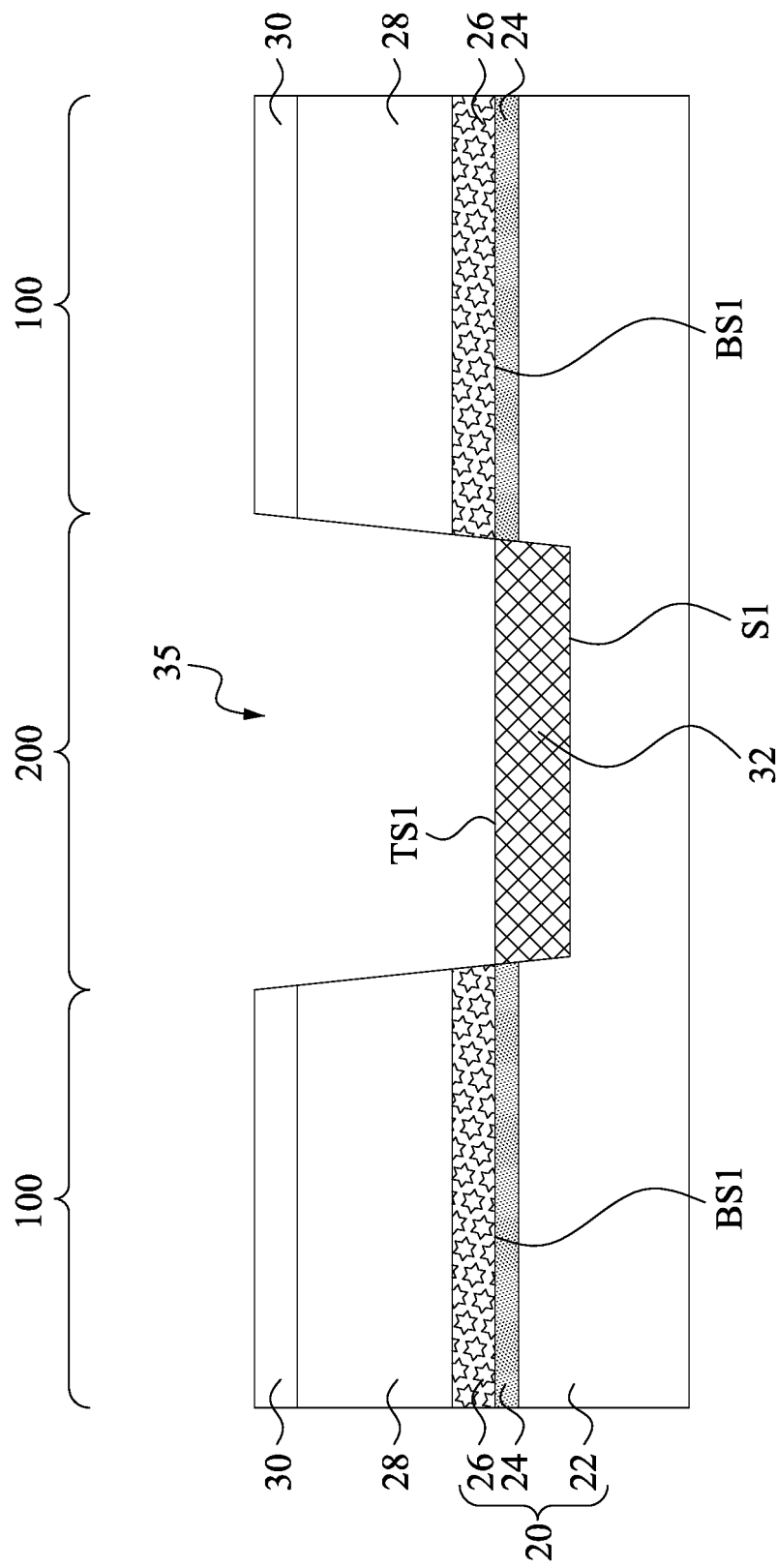

FIGS. 5A and 5B illustrate the selective epitaxy of a semiconductor layer 32 from the exposed silicon layer 22 in the recess 35 in the p-type device region 200. In accordance with some embodiments of the present disclosure, the semiconductor layer 32 includes crystalline silicon. In some embodiments, the semiconductor layer 32 can serve as an anti-punch through (APT) layer and includes APT dopants which may prevent punch through of p-type dopants from subsequently formed source/drain regions (e.g., source/drain regions 272). The APT dopants may include, for example, boron, and can be in-situ doped in the semiconductor layer 32 during the epitaxy process. Since the semiconductor layer 32 is epitaxially grown from the silicon layer 22, it has the same surface orientation as the silicon layer 22. That is, the semiconductor layer 32 has the (100) surface orientation. In some embodiments, the semiconductor layer 32 is made of a material that is the same as the material of the silicon layer 22. In other words, the semiconductor layer 32 may be a silicon layer in some embodiments. In particular, the semiconductor layer 32 may be a silicon layer having a (100) surface orientation in some embodiments. In some embodiments, the semiconductor layer 32 has a thickness in a range from about 10 nm to about 70 nm.

Figure 6A:
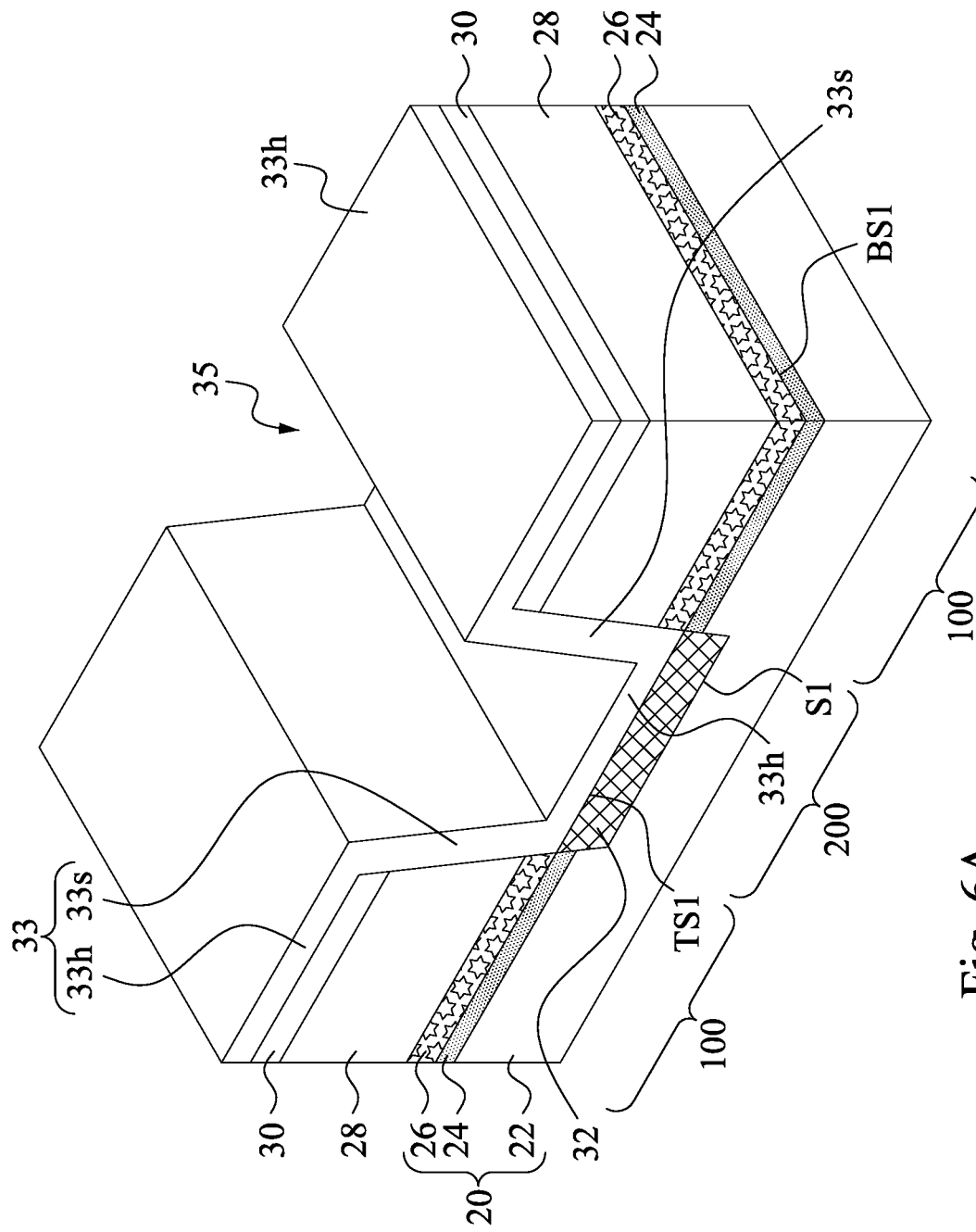
Figure 6B:
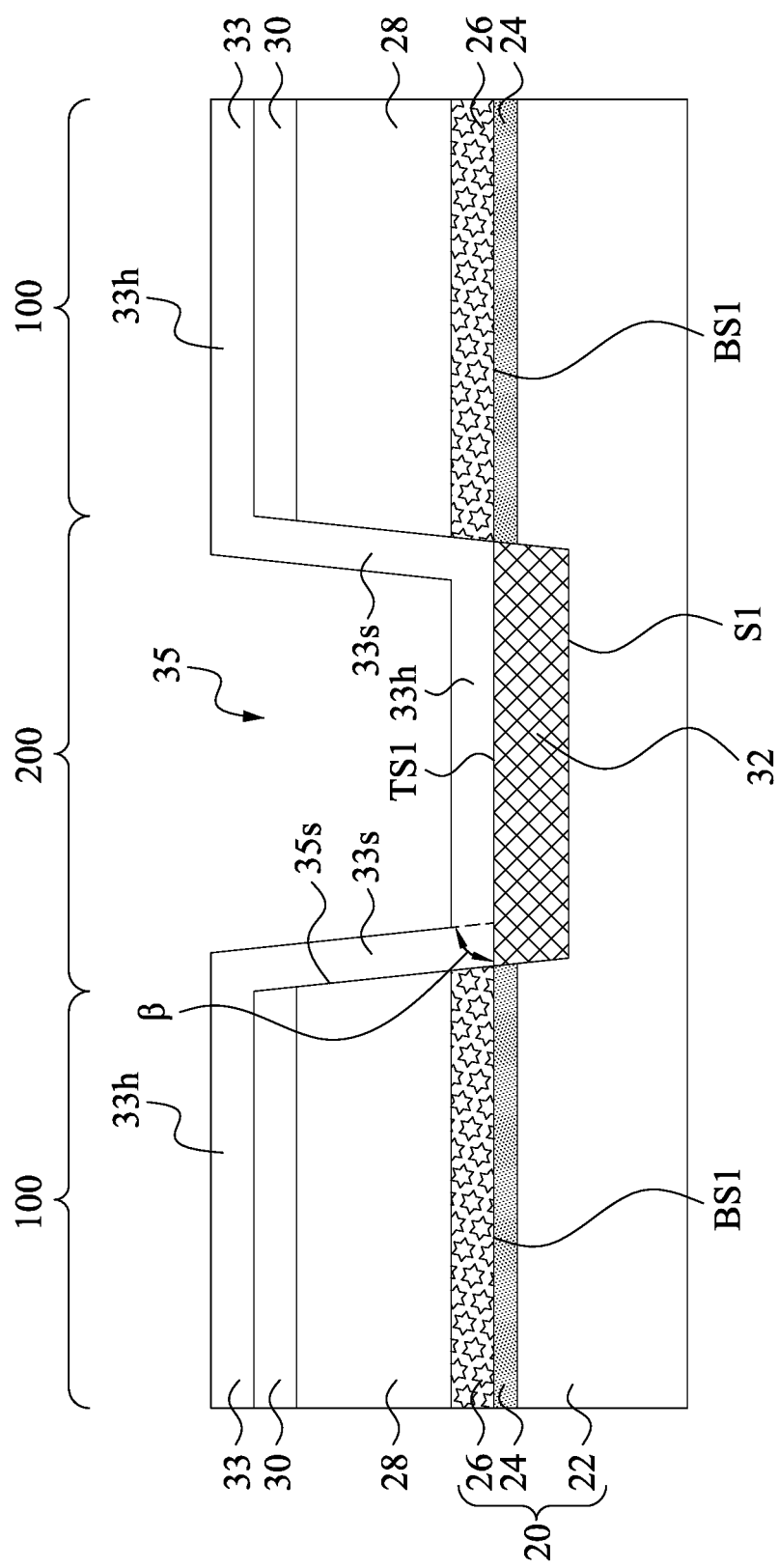

Reference is made to FIGS. 6A and 6B. In accordance with some embodiments of the present disclosure, a spacer layer 33 is conformally formed over the capping layer 30 in the n-type device region 100 and formed in the recess 35 in the p-type device region 200. In greater detail, the spacer layer 33 has horizontal portions 33h over the top surface of the capping layer 30 in the n-type device region 100 and over the top surface TS1 of the semiconductor layer 32 in the p-type device region 200, and slanted portions 33s along the sidewall 35s of the recess 35 (i.e., sidewalls of the silicon layers 26 and the cap layer 30). Due to the tapered profile of the recess 35, the slanted portions 33s of the spacer layer 33 are slanted relative to the top surface TS1 of the semiconductor layer 32 at an angle. In greater detail, an inner surface of the slanted portion 33s of the spacer layer 33 is slanted relative to the top surface TS1 of the semiconductor layer 32 at an angle β less than about 65 degrees, which in turn would lead to increased stacking fault defect density in a subsequently formed SiGe epitaxy layer. In some embodiments, the spacer layer 33 is formed of a material different from the material of the capping layer 30, so that the capping layer 30 can protect the underlying silicon layer 28 against a following anisotropic etching process performed on the spacer layer 33. In some embodiments, the spacer layer 33 is formed of a dielectric material such as silicon oxide, silicon nitride, aluminum oxide, the like or combinations thereof.

Figure 7A:
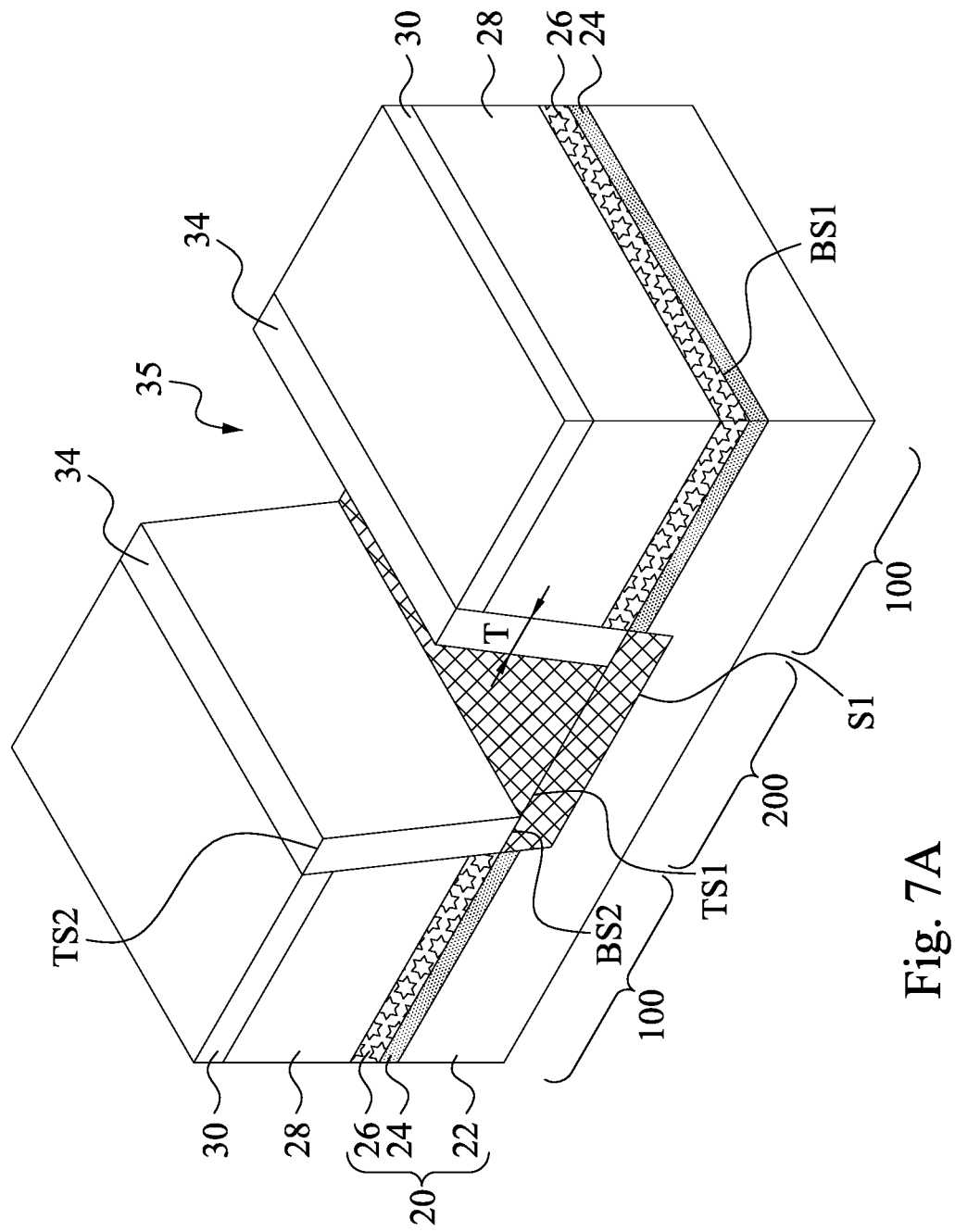
Figure 7B:
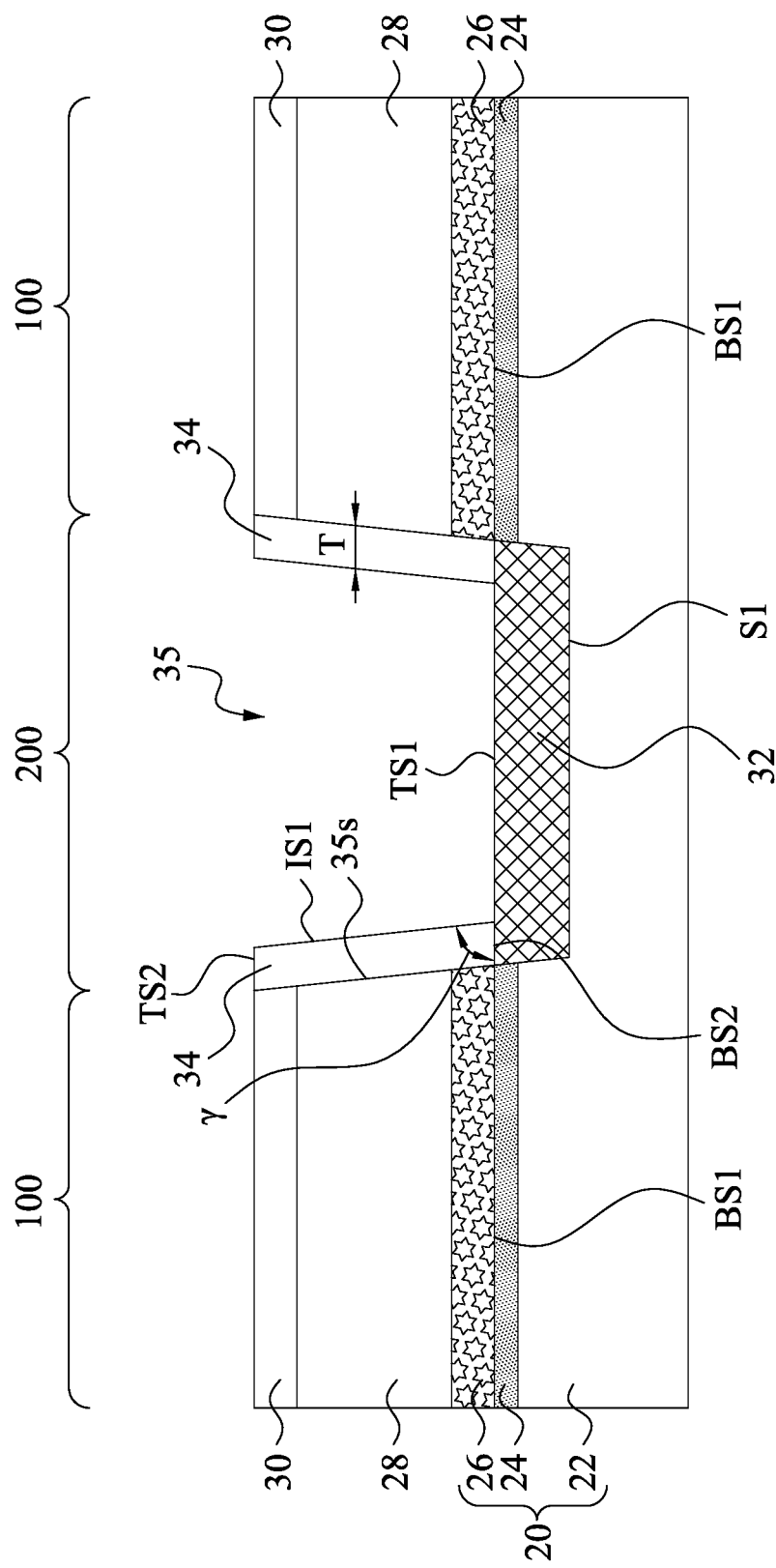
Figure 9A:
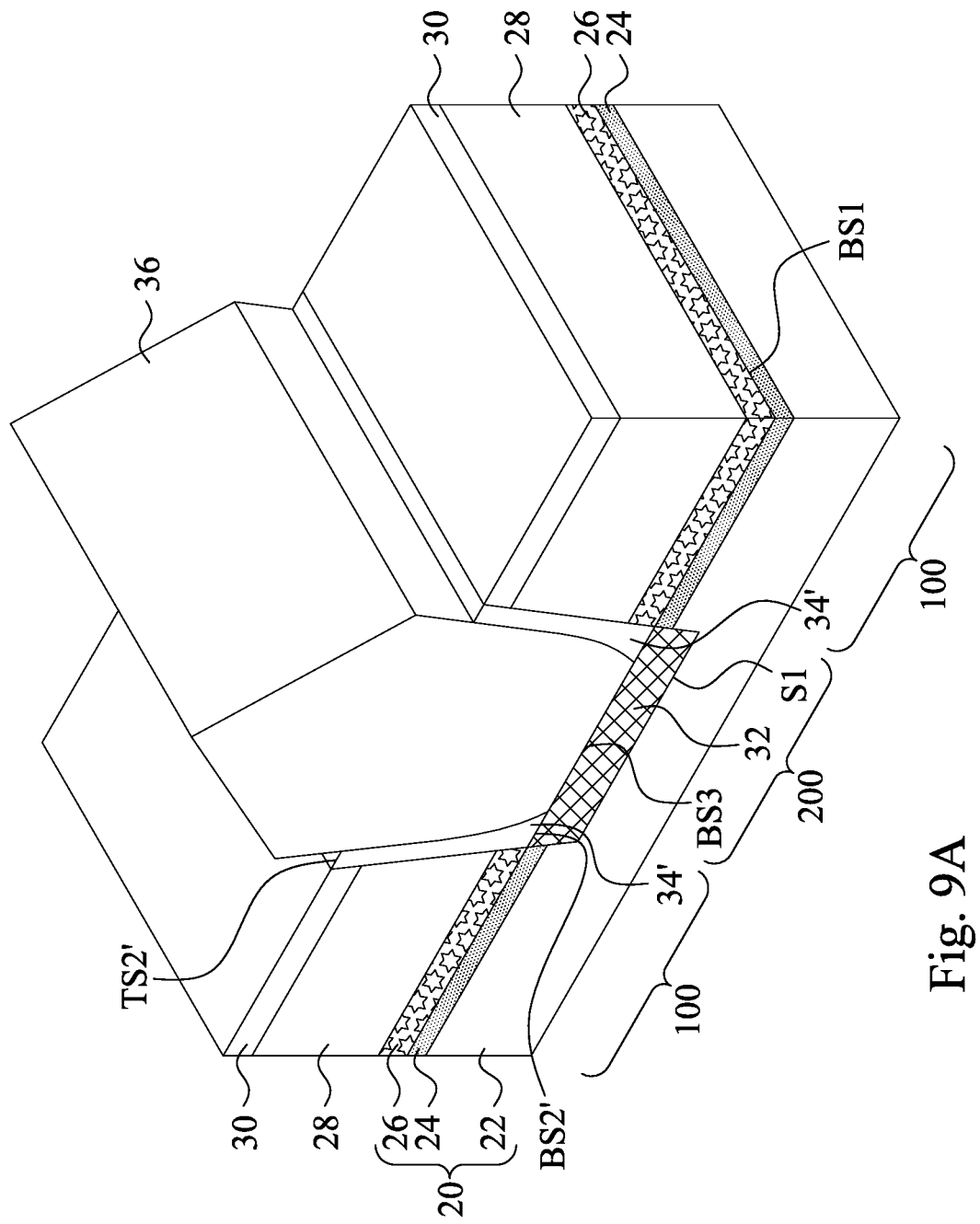
Figure 9B:
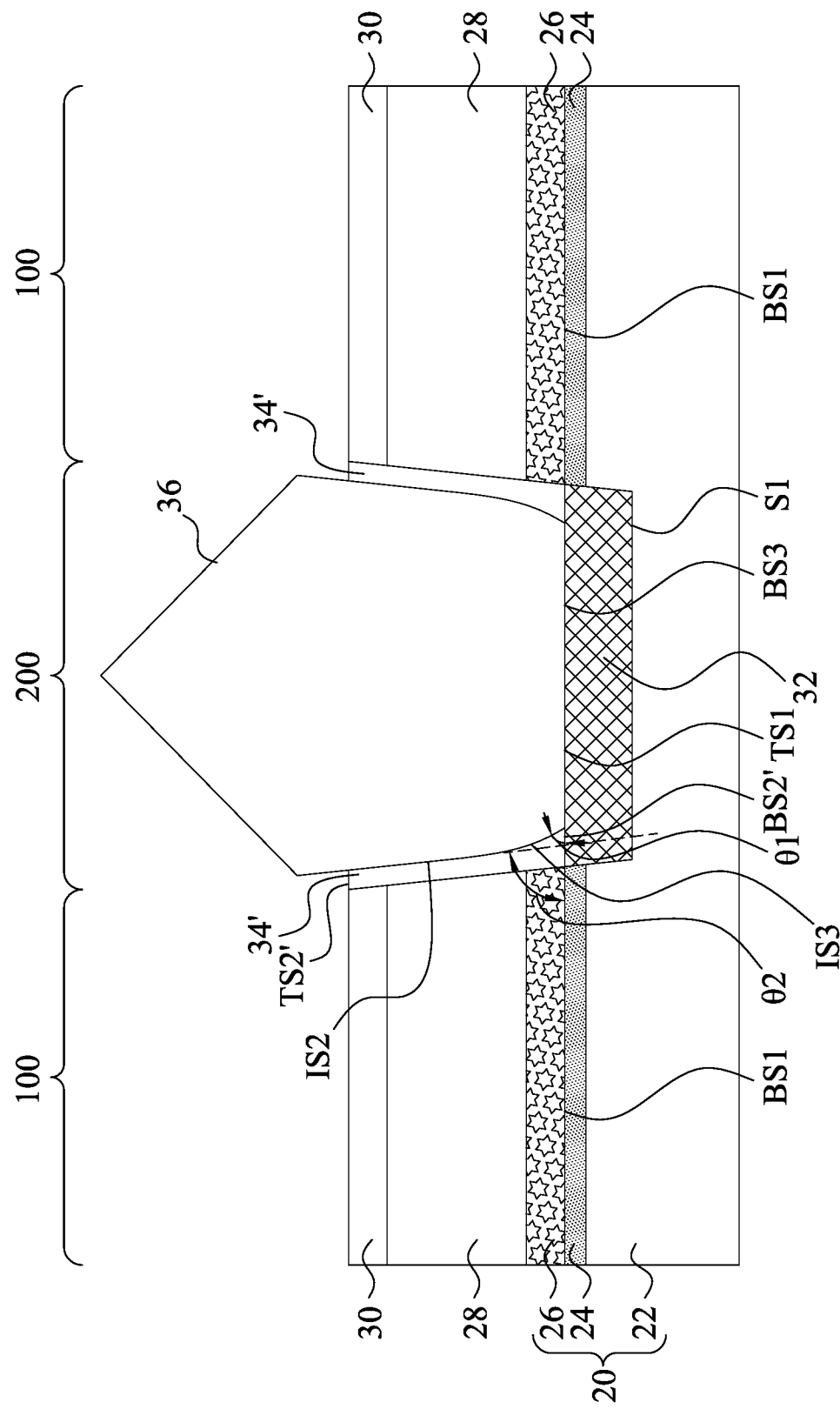

Reference is made to FIGS. 7A and 7B. Next, the horizontal portions 33h of the spacer layer 33 are removed, and the slanted portion 33s remain on the sidewalls 35s of the recess 35 to serve as spacers 34. Removal of the horizontal portions 33h of the spacer layer 33 can be performed using, for example, an anisotropic etching process (e.g., dry etching). In some embodiments, a cleaning process is optionally performed after the etching process to reduce byproducts and chemical residues on the spacers 34 resulting from the etching process. For example, the cleaning process is performed using dilute hydrofluoric acid (DHF), SPM ($H_2SO_4$, $H_2O_2$), and SC1 (deionized water (DIW), $NH_4OH$, $H_2O_2$). The top surface TS1 of the semiconductor layer 32 is exposed as a result of removing the horizontal portion 33h from the top surface TS1. In some embodiments, the spacer 34 has a thickness T in a range from about 1 nm to about 5 nm. In some embodiments, the thickness T of the spacer 34 is uniform. In other words, a top surface TS2 of the spacer 34 has substantially the same area as a bottom surface BS2 of the spacer 34. A sidewall IS1 of the spacer 34 has a slanted profile substantially the same as the slanted profile of the sidewall 35s of the recess 35 in some embodiments. In greater detail, the sidewall IS1 of the spacer 34 is slanted relative to the top surface TS1 of the semiconductor layer 32 at an angle γ less than about 65 degrees, which in turn would lead to increased stacking fault defect density in a subsequently formed SiGe epitaxy layer (e.g., the layer 36 as shown in FIGS. 9A and 9B). The top surface S1 of the silicon layer 22 is substantially parallel to the top surface TS1 of the semiconductor layer 32. Therefore, the spacer 34 is slanted relative to the top surface S1 of the silicon layer 22 at an angle γ as well. Moreover, the spacer etching process often leaves byproducts and chemical residues on the sidewall IS1 of the spacer 34. Even if the cleaning process as described above removes some byproducts and chemical residues from the spacer 34, some byproducts and chemical residues may still remain on the sidewall IS1 of the spacer 34 and result in adverse impact on the subsequently formed SiGe epitaxy layer and hence lower yield.

Figure 8A:
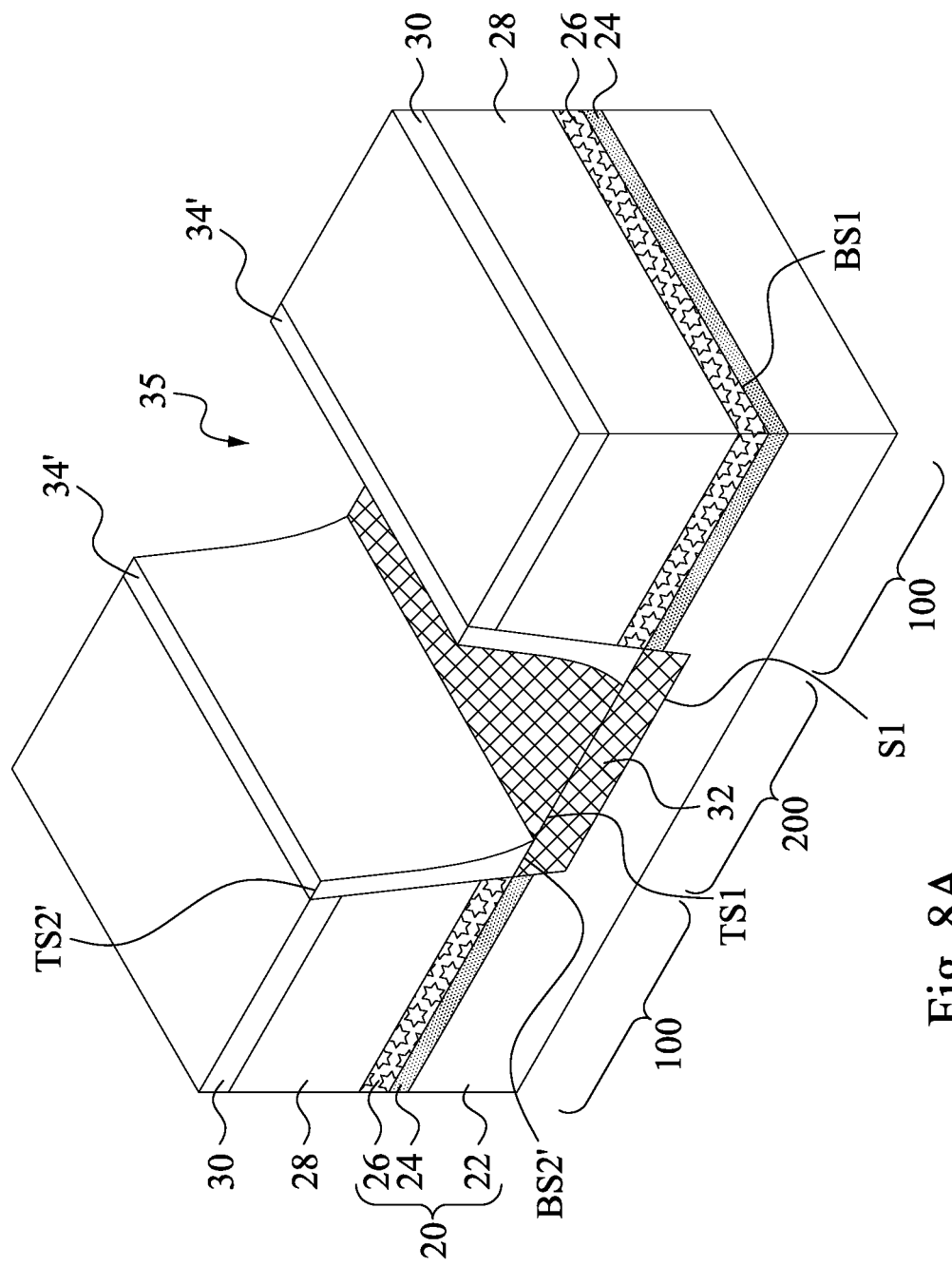
Figure 8B:
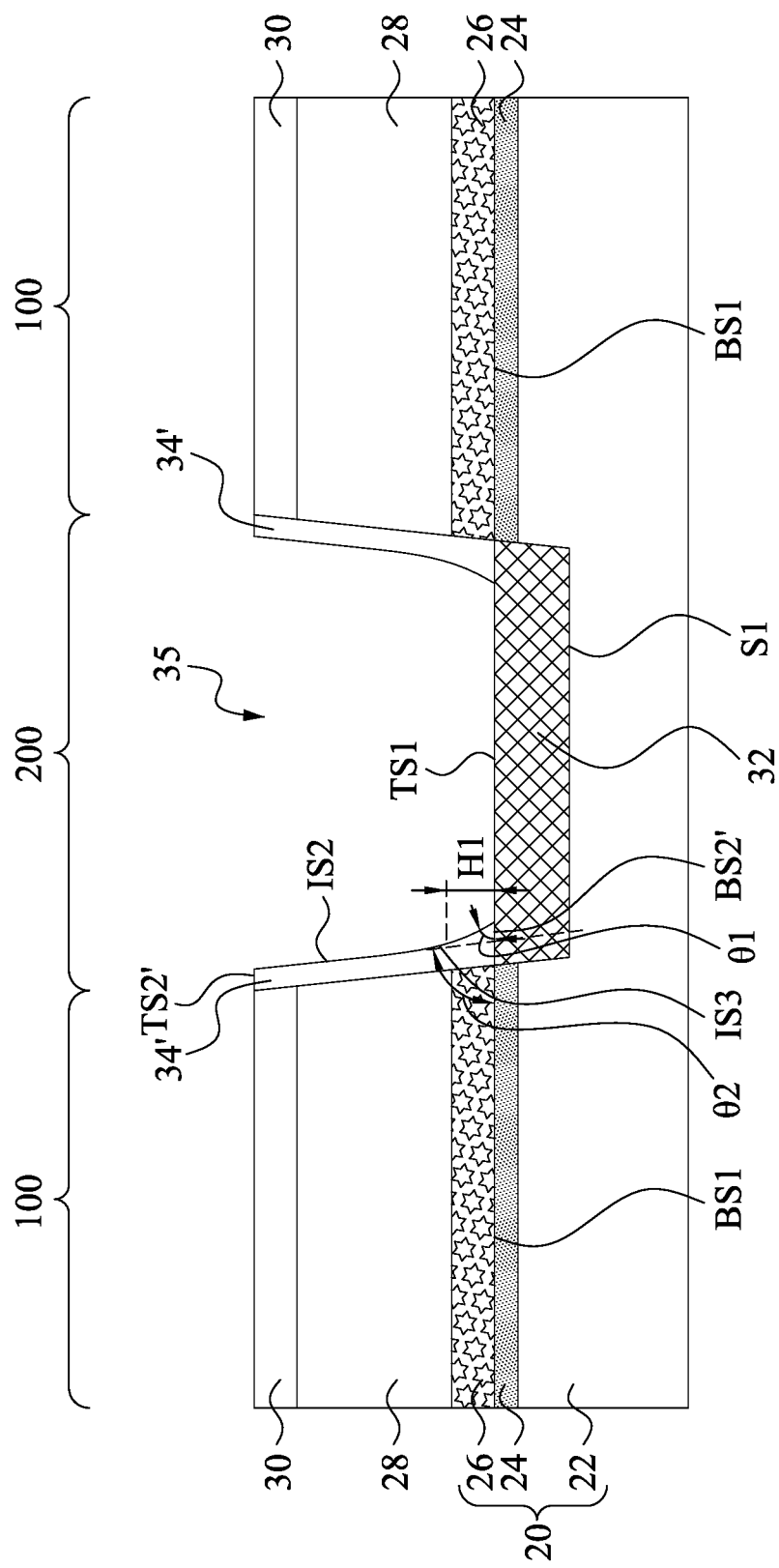

Reference is made to FIGS. 8A and 8B. A reshaping process is performed on the spacer 34 to either reshape the spacer into a spacer 34' having a desired profile suitable for subsequently SiGe epitaxial growth, or further remove byproducts and chemical residues resulting from the spacer 34. In some embodiments, the reshaping process performed on the spacer 34 includes a sequence of a plasma treatment, SPM (sulfuric acid-peroxide mixture) cleaning and FOM (hydrofluoric acid-ozone mixture) cleaning. The plasma treatment uses halogen, for example, fluorine, chlorine, bromine or indium. If chlorine-containing plasma is used to treat the spacer 34, a chlorine-containing gas can be used as a source gas selected from the group consisting of $Cl_2$, HCl, $C_xCl_y$, $C_xH_yCl_z$ and mixtures thereof to generate the chlorine-containing plasma. In some embodiments, the plasma treatment may further use nitrogen-containing gas (e.g., $N_2$ or $N_2O$) and inert gas (e.g., helium, neon, argon, or xenon).

The SPM cleaning is performed by using an SPM solution including sulfuric acid, hydrogen peroxide and deionized (DI) water. The SPM solution provides a strong oxidizing clean that removes organic materials including photoresist and other contaminants. The sulfuric acid and hydrogen peroxide are mixed with a $H_2SO_4/H_2O$ volume ratio ranging from about 2 to about 8. The SPM cleaning can be carried out at a temperature from about 30 to about 180, for a duration ranging from about 20 to about 200 seconds. If process conditions of the SPM cleaning are out of the ranges above, the resulting spacers 34' might have a sidewall profile unsatisfactory for improving following SiGe epitaxy quality.

The FOM cleaning is performed by using a mixture of HF, ozone ($O_3$) and deionized water. The FOM cleaning can effectively remove or minimize defects (e.g., particles or surface damage) on the surfaces of the spacer 34. In some embodiments, the FOM cleaning is performed for a duration ranging from about 30 seconds to about 200 seconds. If process conditions of the FOM cleaning are out of the ranges above, the resulting spacers 34' might have unsatisfactory sidewall profile for improving SiGe epitaxy quality.

The reshaping processes reshapes the spacers 34 as shown in FIGS. 7A and 7B as the spacers 34' as shown in FIGS. 8A and 8B. In some embodiments, the spacer 34' has an upper sidewall IS2 and a lower sidewall IS3 downwards extending from the top sidewall IS2. The upper and lower sidewalls IS2 and IS3 have different slopes. In greater detail, the lower sidewall IS3 is slanted relative to the top surface TS1 of the semiconductor layer 32 at an angle θ1, and the upper sidewall IS2 is slanted relative to the top surface TS1 of the semiconductor layer 32 at an angle θ2, which is greater than the angle θ1. Since the top surface S1 of the silicon layer 22 is substantially parallel to the top surface TS1 of the semiconductor layer 32, the lower sidewall IS3 is slanted relative to the top surface S1 of the silicon layer 22 at an angle θ1, and the upper sidewall IS2 is slanted relative to the top surface S1 of the silicon layer 22 at the angle θ2 as well. In some embodiments, the angle θ1 greater than about 70 degrees, and the angle θ2 is greater than about 75 degrees. If the angle θ1 is less than about 70 degrees, or the angle θ2 is less than about 75 degrees, the stacking fault defect density in the subsequently formed SiGe layer will be unsatisfactory for serving as channels of transistors. In some embodiments, a top surface TS2' of the spacer 34' has an area less than an area of a bottom surface BS2' of the spacer 34'. That is to say, an upper portion of the spacer 34 has a thickness less than a thickness of a lower portion of the spacer 34 below the upper portion of the spacer 34. In some embodiments, an area of the top sidewall IS2 of the spacer 34' is greater than an area of the bottom sidewall IS3 of the spacer 34'.

In some embodiments, a sequence of a baking process and a dry etching process is performed on the spacer 34 after the reshaping process and before a following epitaxy process. In other words, the baking process is performed on the hybrid substrate 20 followed by a dry etching process prior to the subsequent epitaxy process. The baking process is configured to drive solvents from the abovementioned reshaping process (e.g., solvents used in the SPM cleaning or the FOM cleaning) out of the spacer 34'. In some embodiments, the baking process is performed at a temperature from about 700° C. to about 950° C., for a duration ranging from about 10 seconds to about 100 seconds. In some embodiments, the dry etching process is a plasma based cleaning process such as a SiCoNi pre-clean process which is performed using a SiCoNi:$NF_3/NH_3$ plasma with a Ar/He/$H_2$ carrier to remove the silicon oxide that is formed as a result of the natural oxidation of the exposed top surface TS1 of the semiconductor layer 32 in the recess 35. In some embodiments, the sidewall profile of the spacer 34' may be unintentionally changed if it is made of silicon oxide, and process conditions of the SiCoNi pre-clean process are selected such that the angles θ1 remains greater than about 70 degrees and angle θ2 remains greater than about 75 degrees after the SiCoNi pre-clean process.

Afterwards, an epitaxial layer 36 is selectively epitaxially grown from the top surface TS1 of the semiconductor layer 32 in the recess 35 and in contact with the sidewall of the spacer 34', as shown in FIGS. 9A and 9B. In accordance with some embodiments of the present disclosure, the epitaxial layer 36 is formed of a high-mobility semiconductor material such as silicon germanium, germanium (with no silicon), III-V compound semiconductor such as GaAs, InP, GaN, InGaAs, InAlAs, GaSb, AlSb, AlAs, AlP, GaP, combinations thereof, or multi-layers thereof. In the selective epitaxy, an etching gas such as HCl is added in the process gases, so that epitaxial layer 36 is grown from the top surface TS1 of the semiconductor layer 32, and not from dielectric materials such as capping layer 30 and spacers 34'. The spacers 34' masks the sidewalls of the semiconductor layers 26 and 28, so that the epitaxy is achieved from a single surface (the top surface TS1 of the semiconductor layer 32), and hence defects caused by growing from different surfaces are avoided.

Since the epitaxial layer 36 is epitaxially grown from the semiconductor layer 32, it has the same surface orientation as the semiconductor layer 32, that is, the (100) surface orientation and has an upper sidewall and a lower sidewall below the upper sidewall. The upper and lower sidewalls of the epitaxial layer 36 have different slopes. The epitaxial layer 36 may be formed using CVD. In some embodiments where the epitaxial layer 36 is made of silicon germanium, non-limiting examples of silicon-containing gases used as a source of Si include silane ($SiH_4$), dichlorosilane ($SiH_2Cl_2$), and silicone tetrachloride ($SiCl_4$). Non-limiting examples of germanium-containing gases used as a source of Ge include germane ($GeH_4$), germane tetrachloride ($GeCl_4$), and isobutyl germane ($C_4H_{12}Ge$=$(CH_3)_2CHCH_2GeH_3$). The epitaxial layer 36 will be patterned to form fins (see FIG. 13), which will be described below.

The sidewall profile of the reshaped spacers 34' (i.e., a profile of a combination of the upper and lower sidewalls IS2 and IS3) will reduce stacking fault defects in the epitaxial layer 36, because the angle θ1 greater than about 70 degrees, and the angle θ2 is greater than about 75 degrees. FIGS. 10A-10C illustrate lattice structures of the epitaxial layer 36 in contact with different spacers having different sidewall profiles. In FIG. 10A, a SiGe layer 360 is in contact with a $SiO_2$ spacer 340 having a tapered sidewall 340s slanted with respect to a horizontal plane (e.g., (100) plane) at an angle θ3 less than about 65 degrees. In FIG. 10B, a SiGe layer 361 is in contact with a $SiO_2$ spacer 341 having a vertical sidewall 341s perpendicular to the horizontal plane. FIG. 10C is an enlarged view of the structure shown in FIG. 9B. In FIG. 10C, the SiGe layer 36 is in contact with the SiO$_2$ spacer 34' having the upper and lower sidewalls IS2 and IS3, wherein the upper sidewall IS2 is slanted relative to the horizontal plane at the angle θ2 greater than about 75 degrees, and the lower sidewall IS3 is slanted relative to the horizontal plane at the angle θ1 greater than about 70 degrees.

Silicon germanium has a face-centered cubic (fcc) structure having a <112>{111} twin system. That is, crystalline plane P1, such as a (111) plane, of silicon germanium may slip along a direction D1, such as a <11-2> direction, such that defects, such as twin stacking faults, are produced in the silicon germanium. As shown in FIG. 10A, during the epitaxial growth of the SiGe layer 360, because the slanting angle of the tapered sidewall 340s of the spacer 340 is less than 65 degrees, the crystalline plane P1 of the SiGe layer 360 slips along the direction D1 such that twin stacking faults terminate at the interface between the epitaxial layer 360 and the tapered sidewall 340s of the spacer 340, thus resulting in unwanted stacking fault defects in the epitaxial layer 360. In comparison, as shown in FIG. 10B, the vertical sidewall 341s suppress slipping of the crystalline plane P1 of the SiGe layer 361 along the direction D1 and thus decrease twin stacking faults in the SiGe layer 361. For example, as compared with stacking fault defect counts in the SiGe layer 360 in FIG. 10A, the stacking fault defect counts in the SiGe layer 361 in FIG. 10B is reduced by about one order. For example, a number of simulated stacking fault defect counts in the SiGe layer 360 in FIG. 10A is from about 108000 to about 109000, and a number of simulated stacking fault defect counts in the SiGe layer 361 in FIG. 10B is from about 10600 to about 10700. This comparison result proves that the larger the slanted angle of the spacer, the less the stacking fault defect counts. As a result, even if in FIG. 10C, the crystalline plane P1 of the SiGe layer 36 also slips along the direction D1 and thus still results in twin stacking faults at the interface between the epitaxial layer 36 and the reshaped spacer 340', the stacking fault defect density in the SiGe layer 36 is still less than that in the SiGe layer 360, because the angles θ1 and θ2 of the sidewalls IS2 and IS3 of the spacer 34' are greater than the angle θ3 of the tapered sidewall 340s of the spacer 340.

Figure 11A:
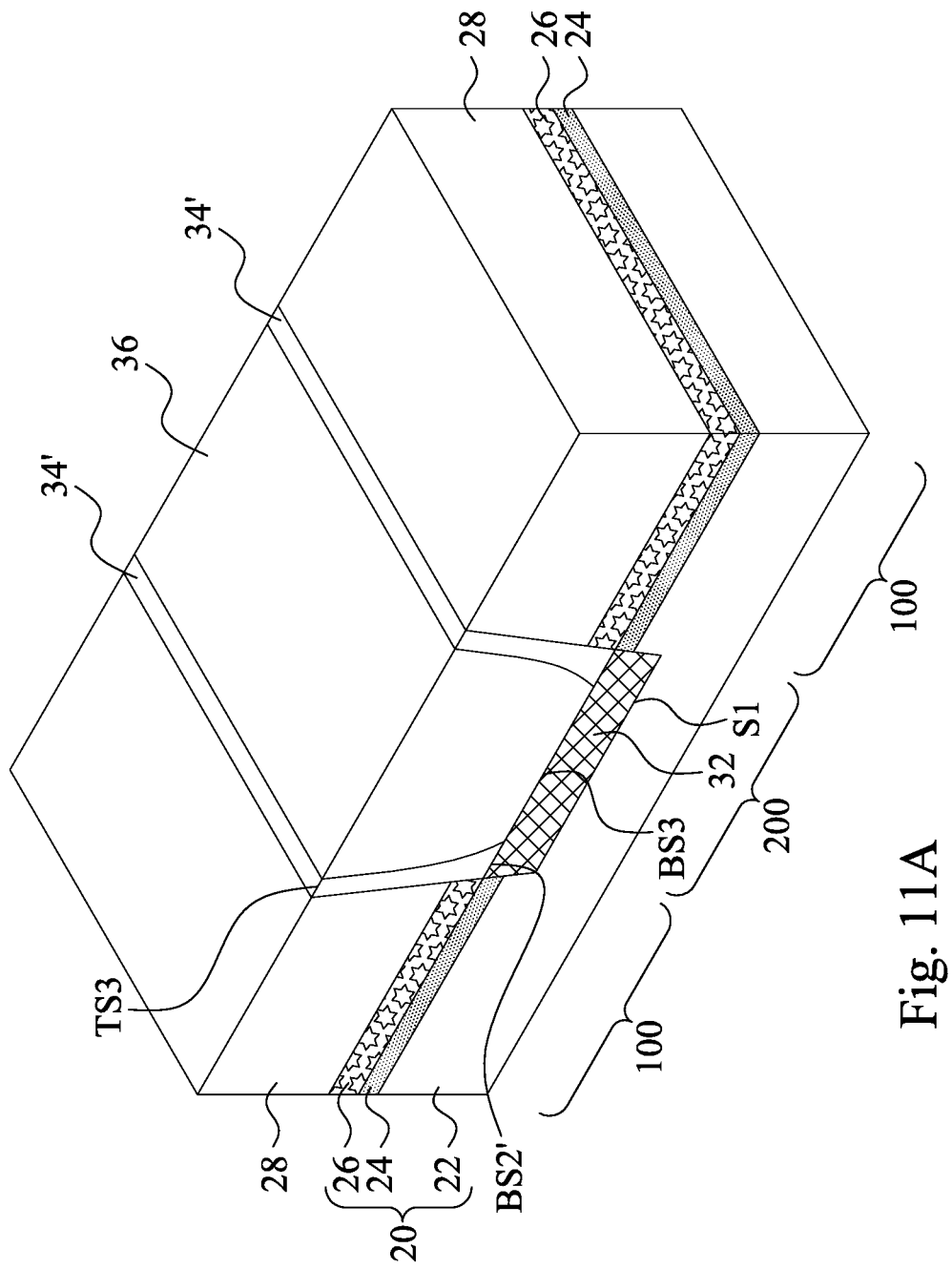
FIGS. 11A-11B show various lattice structures of a portion of an epitaxial layer adjacent to a portion of a spacer in accordance with some embodiments.
Figure 11B:
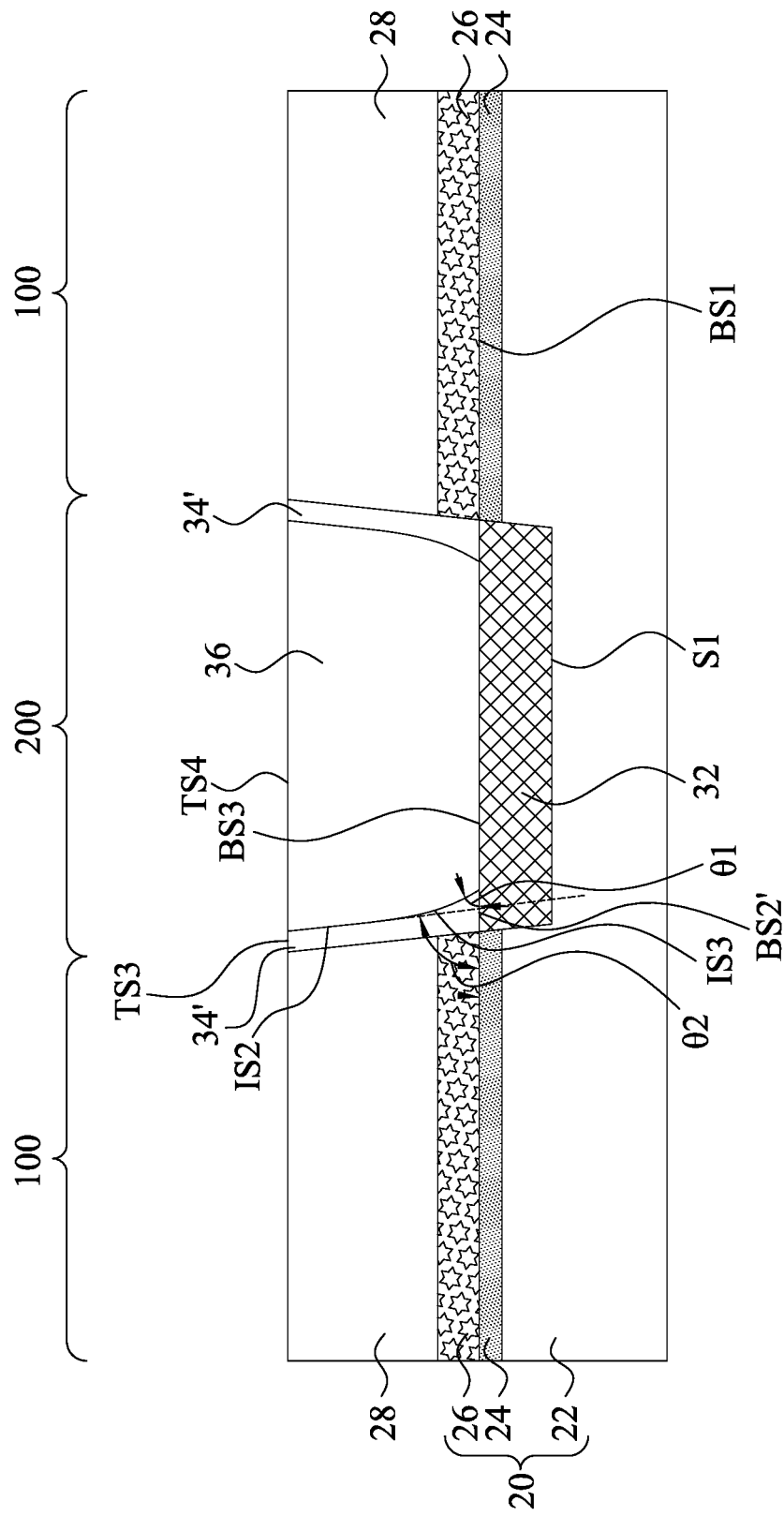

After the epitaxy of the epitaxial layer 36, a planarization step such as Chemical Mechanical Polishing (CMP) or mechanical grinding is performed to level the top surface of the epitaxial layer 36 with the top surface of the silicon layer 28, as shown in FIGS. 11A and 11B. That is, a top surface TS3 of the spacer 34' is substantially level with a top surface TS4 of the epitaxial layer 36. In accordance with some embodiments of the present disclosure, the planarization is performed using the silicon layer 28 as a stop layer. In accordance with alternative embodiments of the present disclosure, the planarization is performed using the capping layer 30 as a stop layer, followed by an etching process to remove the capping layer 30.

Figure 12:
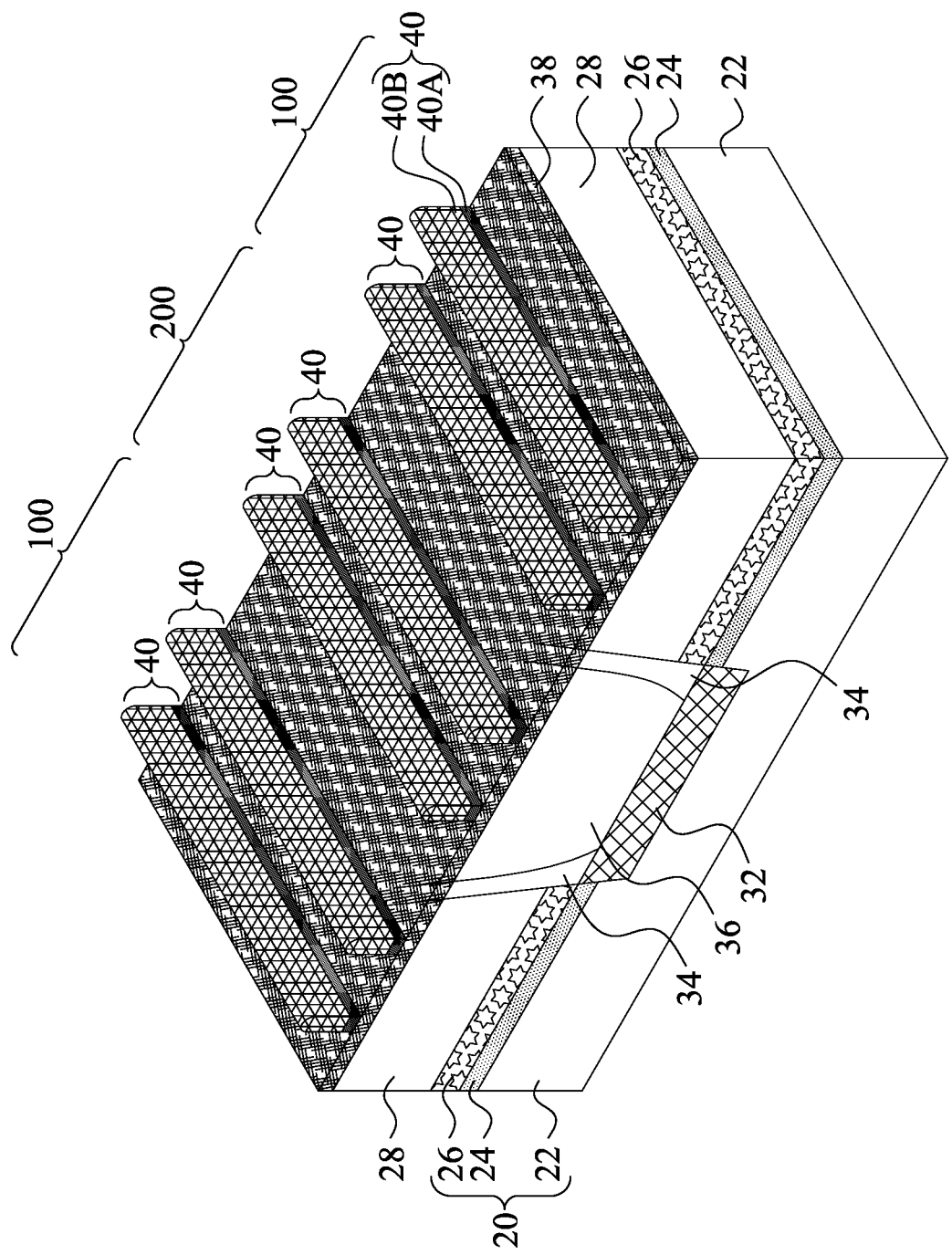
FIGS. 12 through 22 illustrate the perspective views of intermediate stages in the formation of Fin Field-Effect Transistors (FinFETs) in accordance with some embodiments.

Referring to FIG. 12, a protection layer 38 is formed. In accordance with some embodiments of the present disclosure, the protection layer 38 is formed of silicon, and is deposited on the top surface the structure shown in FIG. 10A. The protection layer 38 is also free from germanium. The deposition may be achieved through an epitaxy process, so that the silicon layer is a crystalline layer. In accordance with alternative embodiments of the present disclosure, the protection layer 38 is a polysilicon layer.

One or more mask layers are deposited over the protection layer 38, and are then patterned to form masks 40, which are used as etching masks for forming semiconductor strips. In accordance with some embodiments of the present disclosure, the masks 40 include a plurality of layers formed of different materials. For example, the masks 40 may include layers 40A formed of silicon oxide, and layers 40B over the respective layers 40A, with the layers 40B formed of silicon nitride. In the formation of the masks 40, the protection layer 38 protects the underlying semiconductor layer 32 from oxidation, for example, due to the elevated temperature adopted in the deposition of the mask layers. Silicon germanium is prone to oxidation, and also has an oxidation rate significantly higher than the oxidation rate of silicon. Accordingly, by forming the protection layer 38, the semiconductor layer 32 is protected from the undesirable oxidation.

Figure 13:
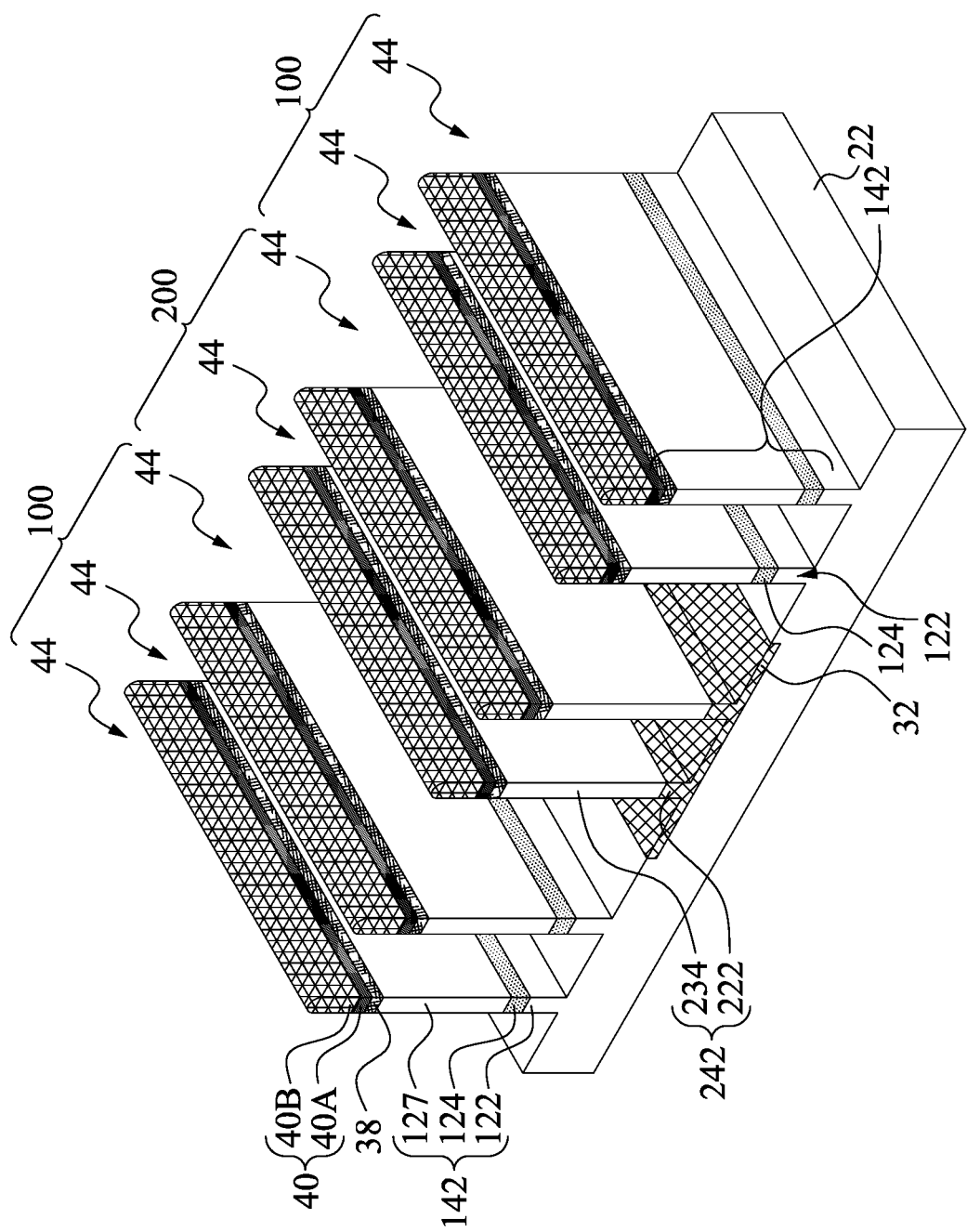

Referring to FIG. 13, an etching process is performed to etch the substrate and the semiconductor layers, so that strips 142 and 242 are formed in the n-type device region 100 and the p-type device region 200, respectively. Recesses 44 are formed to separate the strips 142 and 242. The strips 142 include strip portions 122, 124, and 127. The strip portions 122 are the remaining portions of the patterned silicon layer 22. The dielectric strip portions 124 are the remaining portions of the dielectric layer 24 (FIG. 10A). The strip portions 127 are the remaining portions of the silicon layers 26 and 28 (FIG. 10A). In accordance with some embodiments of the present disclosure, the silicon layers 26 and 28 have the (110) top surface orientation. Accordingly, the strip portions 127 also have the (110) top surface orientation. In accordance with some embodiments of the present disclosure, the silicon layers 26 and 28 are (100) R45 layers. Accordingly, the top surface of the strips 142 have the (100) R45 surface orientation. The sidewalls of the strips 142 have the (100) surface orientation. The strips 242 include strip portions 222 and 234. The strip portions 222 are the remaining portions of the semiconductor layer 32 (i.e., APT layer 32 as shown in FIG. 12). Strip portions 234 are the remaining portions of the epitaxial layer 36 (i.e., SiGe layer 36 as shown in FIG. 12). Accordingly, the strip portions 222 and 234 also have the (100) top surface orientation. That is to say, the strips 142 and the strips 242 (e.g., strip portions 222 and 234) have different top surface orientations. Moreover, because strip portions 234 are SiGe strips resulting from the SiGe layer 36, the SiGe strips 234 can have reduced stacking fault defect density as compared with SiGe strips resulting from a SiGe layer 360 as shown in FIG. 10A (i.e., the SiGe layer formed in contact with a tapered sidewall 340s slanted at an angle θ3 less than about 65 degrees), which in turn will improve device performance of transistors formed using the SiGe strips 234 as channels. In some embodiments, the stacking fault defect density of the SiGe strip 234 is less than about 100/cm$^2$ detected by KLA Tencor defect inspection (e.g., PUMA), or other defect inspection tools. If the stacking fault defect density of the SiGe strip 234 is greater than about 100/cm$^2$, the device performance and reliability will be adversely affected.

The strips may be patterned by any suitable method. For example, the strips may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the strips.

Figure 14:
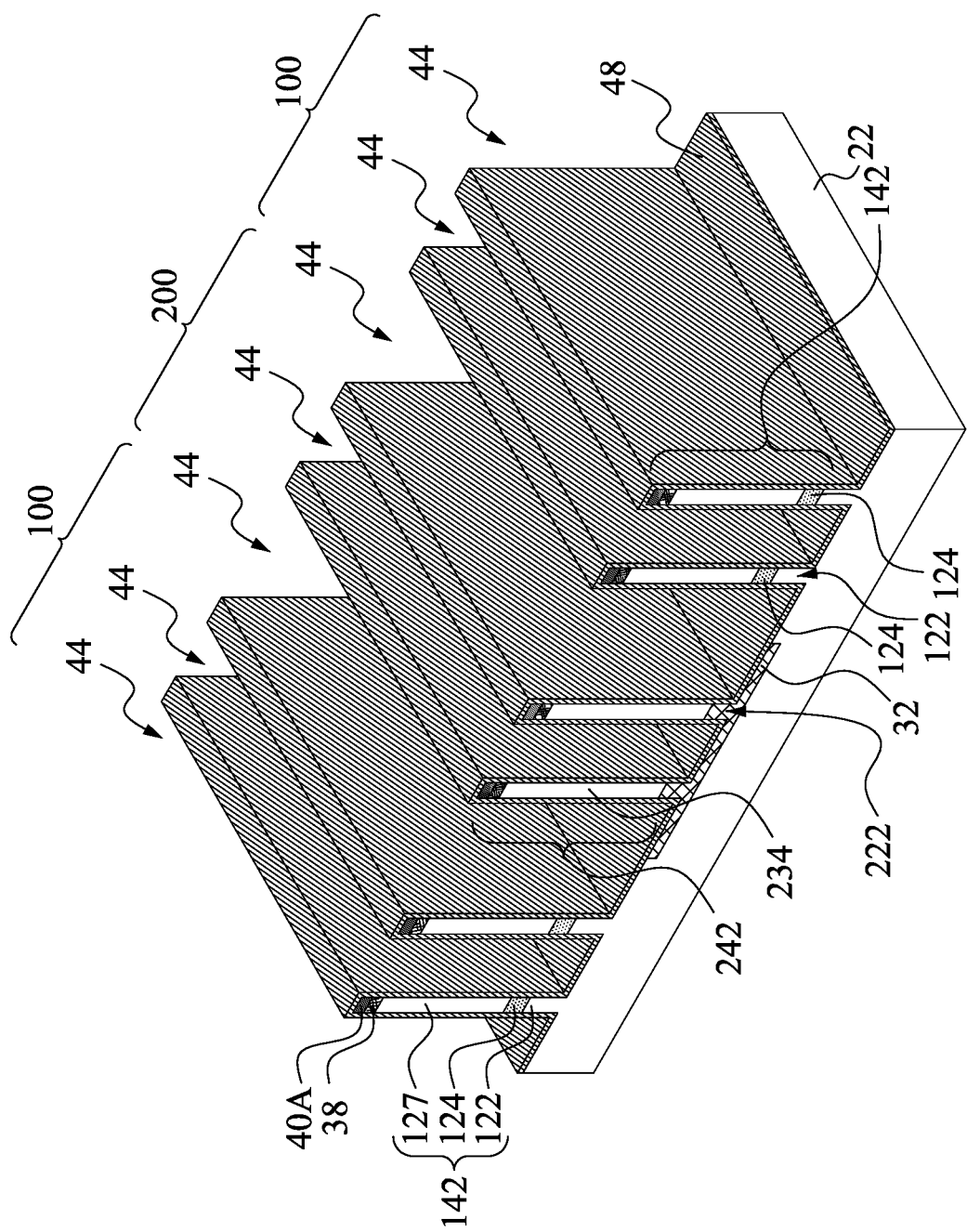

FIG. 14 illustrates the formation of a liner 48, which is used to mask the sidewalls of the strip 142 and 234 and protect the same from oxidation. In accordance with some embodiments of the present disclosure, the liner 48 is formed of silicon, and is free from or substantially free from germanium. Furthermore, the liner 48 may be free from oxygen and nitrogen, and hence does not include silicon oxide and silicon nitride. The liner 48 may be formed using a conformal deposition method such as Atomic Layer Deposition (ALD) or Chemical Vapor Deposition (CVD). The liner 48 thus extends into the recesses 44.

Figure 15:
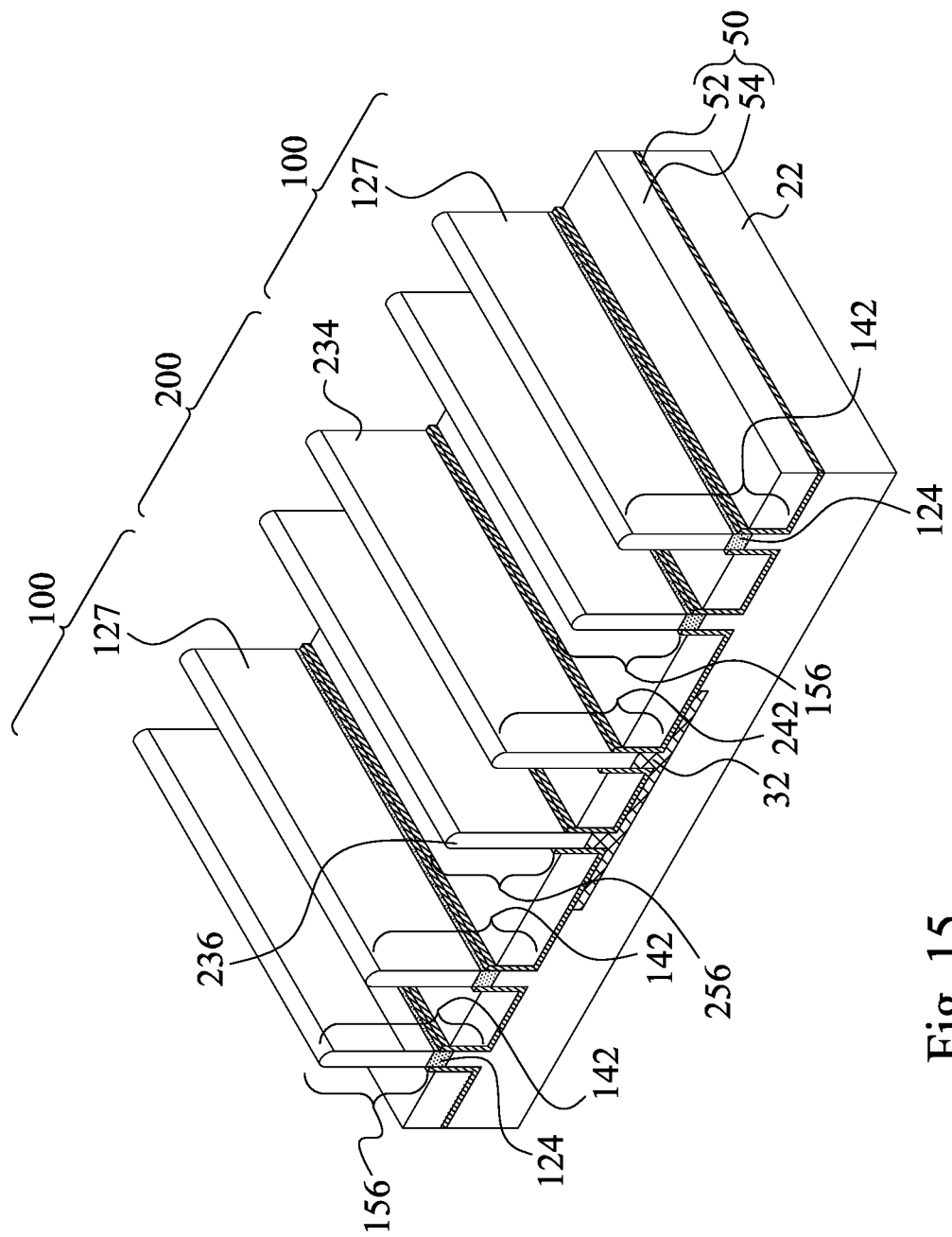

FIG. 15 illustrates the formation of STI regions 50, which include dielectric liners 52 and dielectric regions 54 over the dielectric liners 52. In accordance with some embodiments of the present disclosure, a conformal deposition method is used to deposit a conformal dielectric liner 52 on the exposed surfaces of the structure shown in FIG. 14. For example, the dielectric liners 52 may be formed using ALD or CVD. Next, the remaining portions of the recesses 44 (FIG. 14) are filled with the dielectric regions 54. The dielectric regions 54 may be formed using Flowable Chemical Vapor Deposition (FCVD), spin-on coating, or the like. In accordance with some embodiments in which FCVD is used, a silicon- and nitrogen-containing precursor (for example, trisilylamine (TSA) or disilylamine (DSA)) is used, and hence the resulting dielectric material is flowable (jelly-like). In accordance with alternative embodiments of the present disclosure, the flowable dielectric material is formed using an alkylamino silane-based precursor. During the deposition, plasma is turned on to activate the gaseous precursors for forming the flowable oxide.

In the formation of the dielectric liners 52 and the dielectric regions 54, the temperature of the formation process may be elevated, which is likely to cause the oxidation of the strip portions 234 if the strip portions 234 are exposed. The liner 48 (FIG. 14) thus protects the strip portions 234 from the oxidation. As a result, the liner 48 (or at least the portions of the liner 48 contacting the strip portions 124, 127, and 234) may be oxidized during the formation of the dielectric liners 52 and the dielectric regions 54, and hence is converted into a silicon oxide layer.

Next, a planarization such as CMP or mechanical grinding is performed on the dielectric regions 54 and the dielectric liners 52. The planarization may be performed using the masks 40 (FIG. 14) as a stop layer. Next, the masks 40 are removed, followed by recessing the dielectric regions 54 and the dielectric liners 52. The resulting structure is shown in FIG. 15. The remaining portions of the dielectric regions 54 and the dielectric liners 52 are referred to as the STI regions 50. In accordance with some embodiments of the present disclosure, the recessing is performed until the recessed STI regions 50 have their top surfaces lower than the top surfaces of the dielectric strip portions 124, so that the sidewalls of the dielectric strip portions 124 have at least some portions exposed. In accordance with alternative embodiments of the present disclosure, the recessed STI regions 50 have their top surfaces level with, higher than, or lower than the bottom surfaces of the dielectric strip portions 124. Throughout the remainder of the description, the portions of the strips 142 and 242 higher than the top surfaces of the STI regions 50 will be referred to as fins (or protruding fins) 156 and 256.

Figure 16:
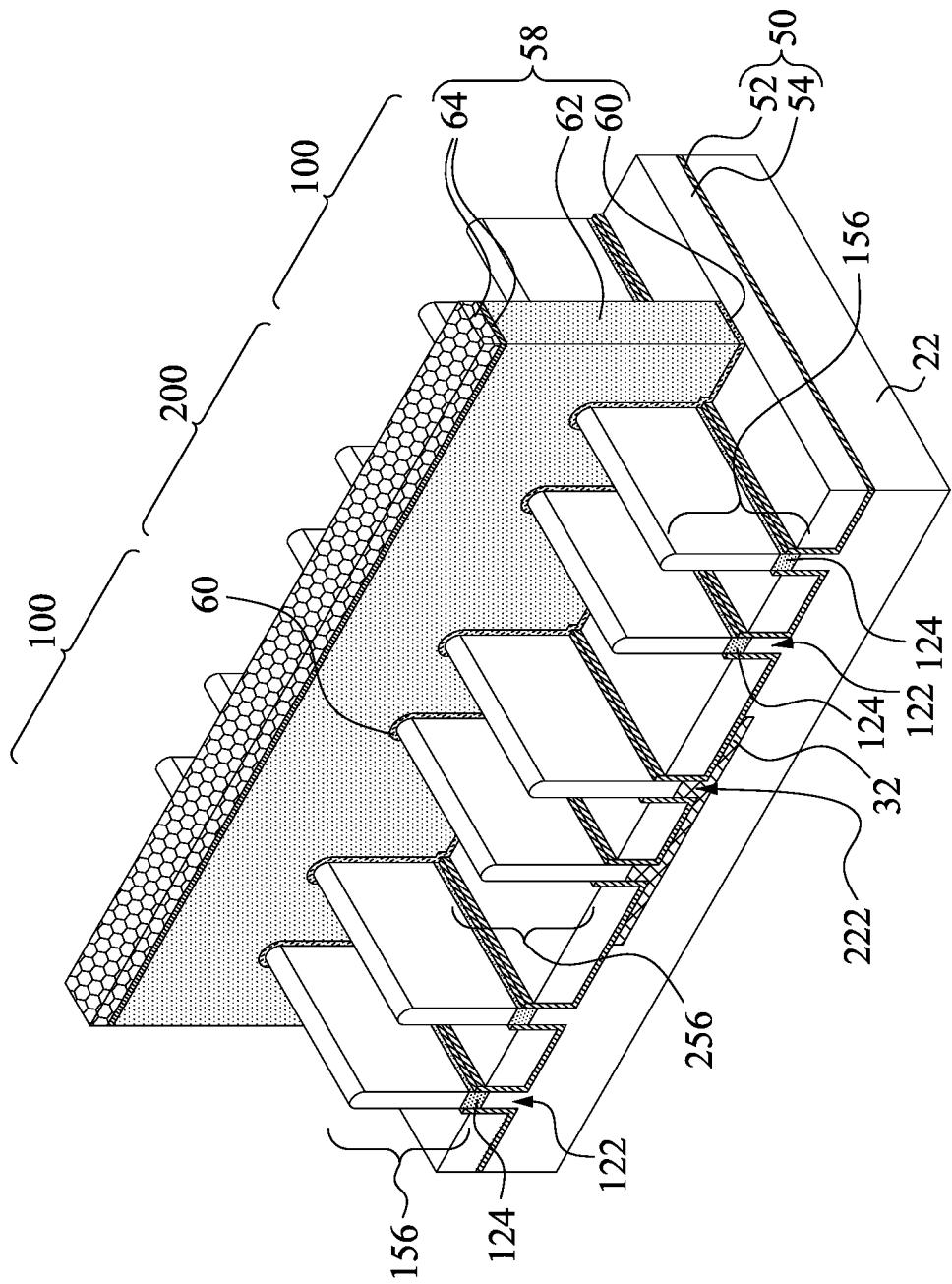

Referring to FIG. 16, a dummy gate stack 58 is formed on the top surfaces and the sidewalls of the (protruding) fins 156 and 256. It is appreciated that although one dummy gate stack 58 is illustrated for clarity, there may be a plurality of dummy gate stacks formed, which are parallel to each other, with the plurality of dummy gate stacks crossing the same semiconductor fin(s) 156 and 256. The dummy gate stack 58 may include a dummy gate dielectric 60 and a dummy gate electrode 62 over the dummy gate dielectric 60. The dummy gate electrode 62 may be formed, for example, using polysilicon, and other materials may also be used. The dummy gate stack 58 may also include a hard mask layer 64 (or a plurality of hard mask layers 64) over the dummy gate electrode 62. The hard mask layer 64 may be formed of silicon nitride, silicon carbo-nitride, or the like. The dummy gate stack 58 may cross over a single one or a plurality of the protruding fins 156 and 256 and/or the STI regions 50. The dummy gate stack 58 also has a lengthwise direction perpendicular to the lengthwise directions of the protruding fins 156 and 256.

Figure 17:
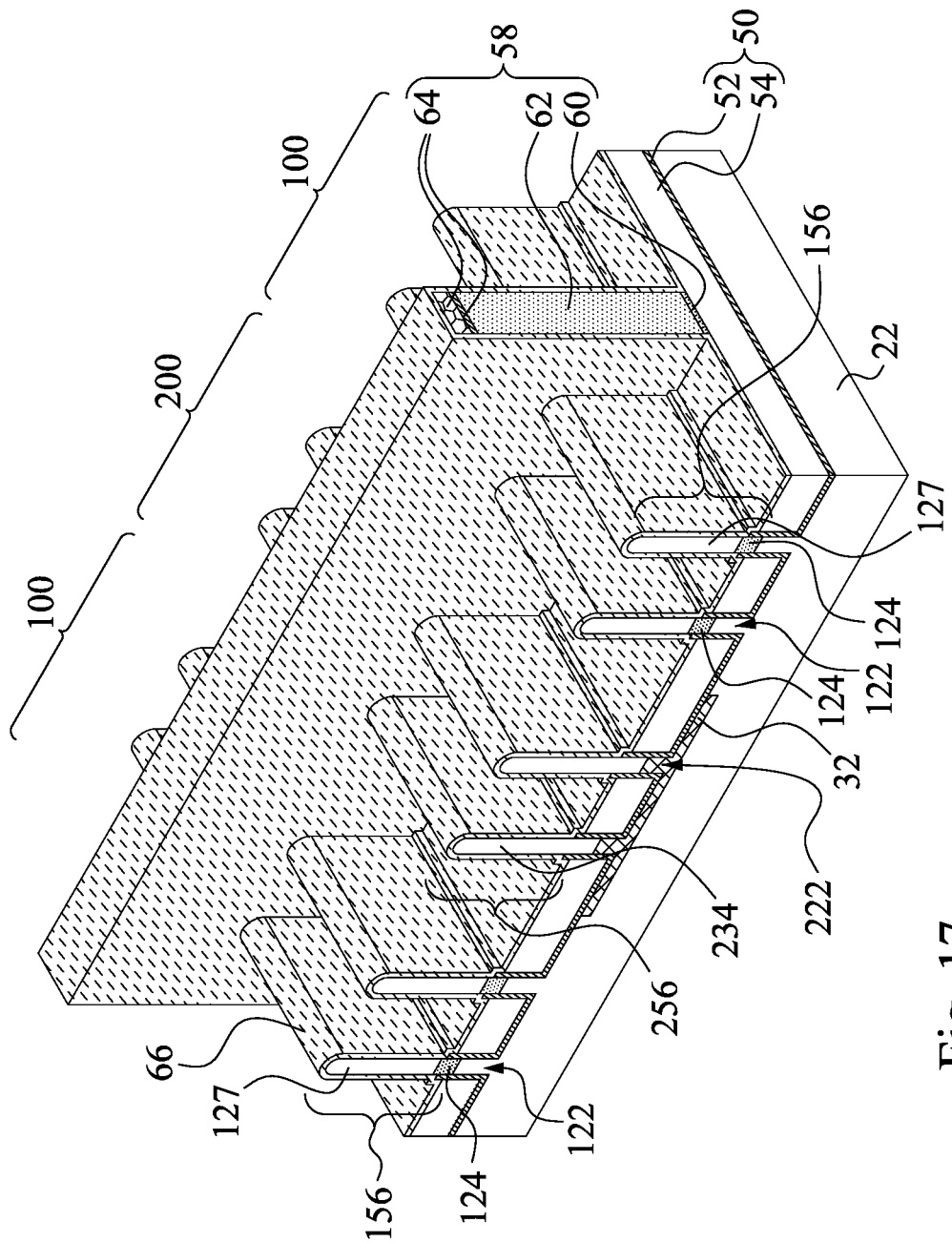

Next, referring to FIG. 17, a spacer layer 66 is deposited. In accordance with some embodiments of the present disclosure, the spacer layer 66 is formed of a dielectric material such as silicon nitride, silicon carbon-oxyitride (SiCN), or the like, and may have a single-layer structure or a multi-layer structure including a plurality of dielectric layers. The formation may be performed through a conformal deposition method such as ALD or CVD.

Figure 18:
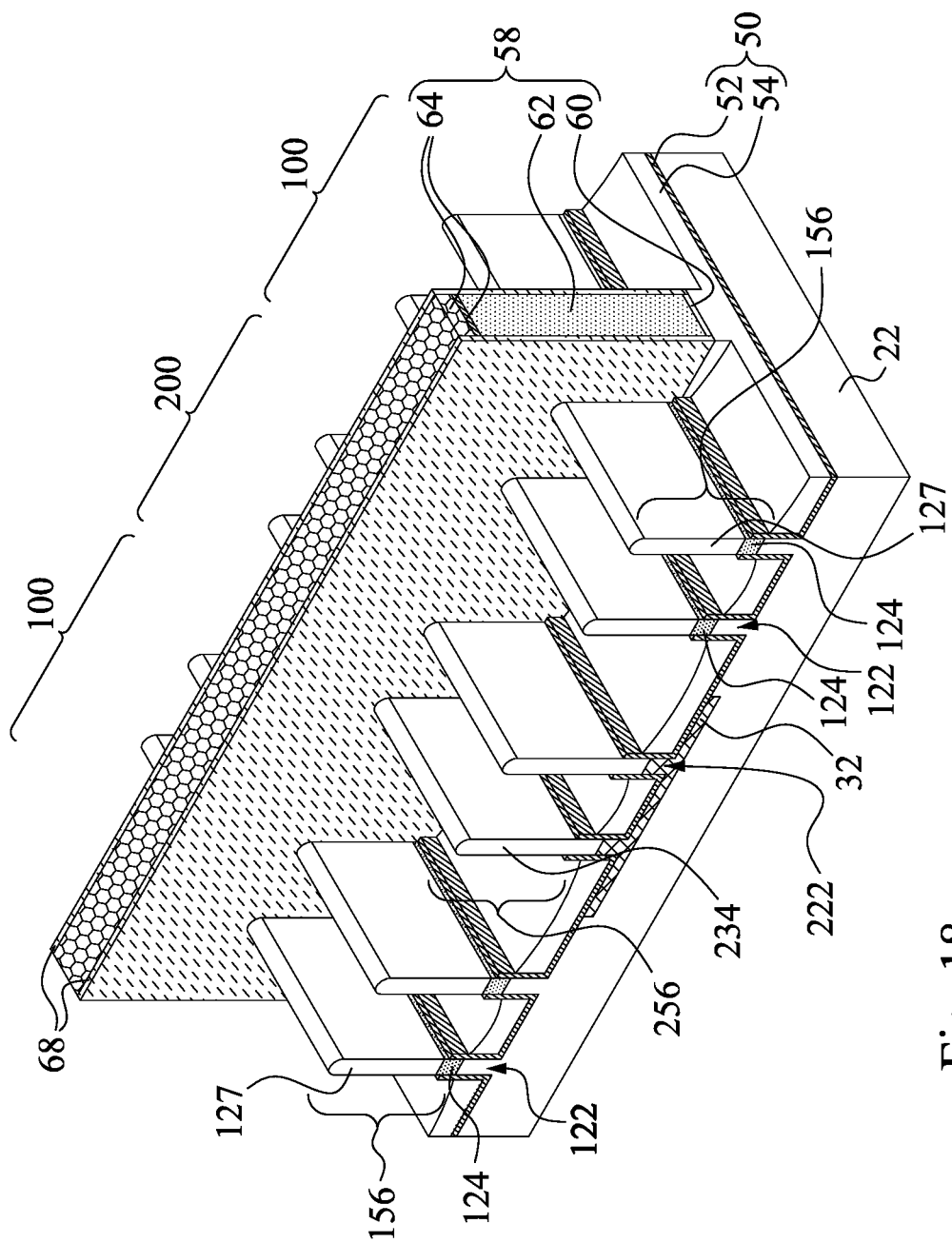

FIG. 18 illustrates the etching of the spacer layer 66, resulting in the formation of gate spacers 68 on the sidewalls of the dummy gate stack 58. The etching is performed anisotropically, so that the portions of the spacer layer on the protruding fins 156 and 256 are removed.

Figure 19:
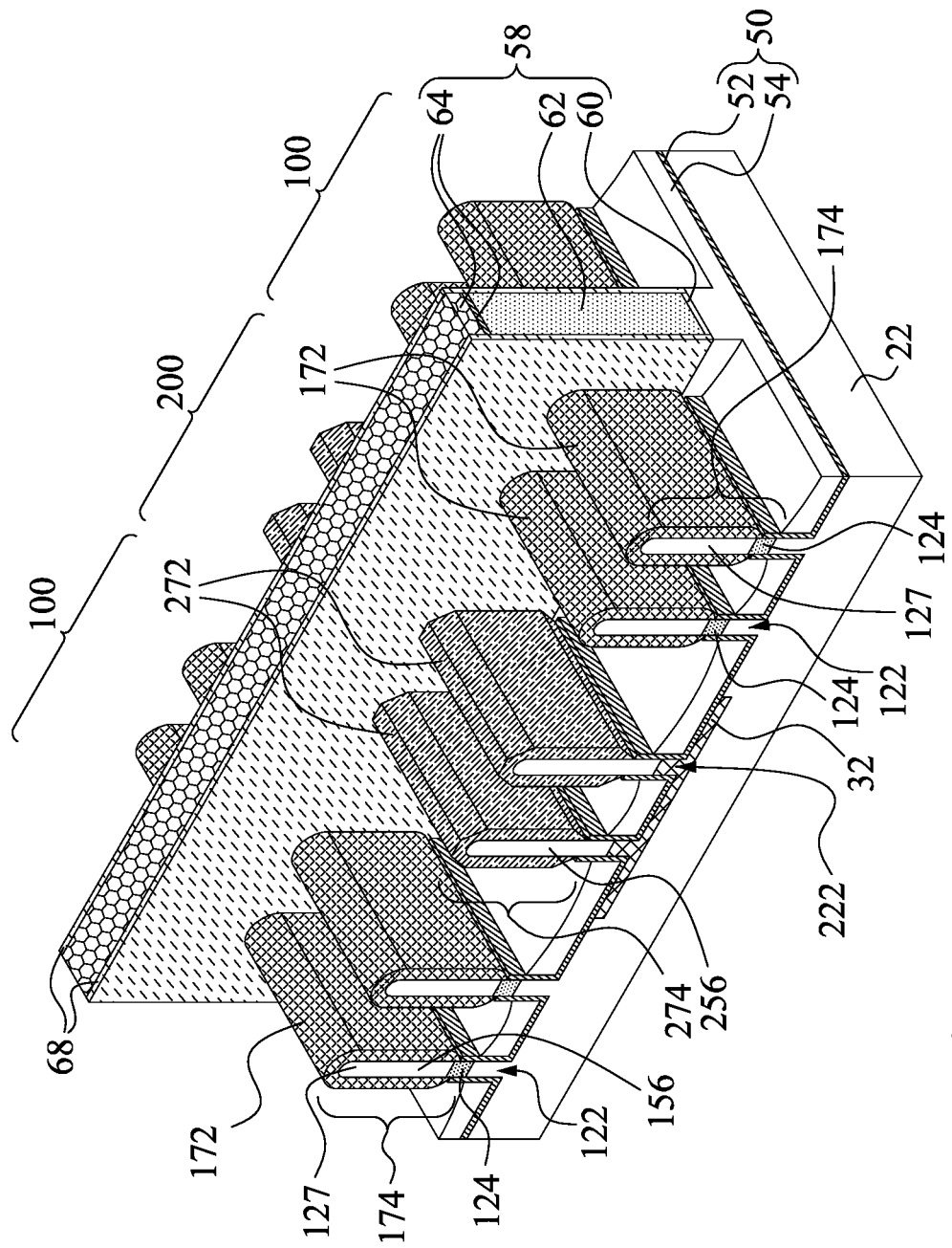

Next, epitaxy regions 172 and 272 are formed by selectively growing semiconductor materials on the protruding fins 156 and 256, respectively, resulting in the structure in FIG. 19. The epitaxy regions 172 and 272 are epitaxially grown in different epitaxy processes, with each including forming a mask layer (not shown) on one of the epitaxy regions 172 and 272, so that the epitaxy regions may be formed on the other one of the epitaxy regions 172 and 272. Depending on whether the resulting FinFET is a p-type FinFET or an n-type FinFET, a p-type or an n-type impurity may be in-situ doped during the epitaxy. For example, the epitaxy regions 172 may be formed of silicon phosphorous (SiP) or silicon carbon phosphorous (SiCP), and the epitaxy regions 272 may be formed of silicon germanium boron (SiGeB).

After the epitaxy step, the epitaxy regions 172 and the strip portions 127 may be further implanted with an n-type impurity to form source and drain regions 174 for the n-type FinFET. The epitaxy regions 272 and the strip portions 234 may also be implanted with a p-type impurity to form source and drain regions 274 for the p-type FinFET. In some embodiments, the semiconductor layer 32 and the strip portions 222 made of the material of the APT layer can prevent punch through of the p-type dopant during the implantation process performed on the epitaxy regions 272 and the strip portions 234. In accordance with alternative embodiments of the present disclosure, the implantation step is skipped when the epitaxy regions 172 and 272 are in-situ doped with the p-type or n-type impurity during the epitaxy.

Although FIG. 19 illustrates the source/drain regions 174 separated from each other, and the source/drain regions 274 separated from each other, it is to be noted that depending on how long the epitaxy processes last, the source/drain regions 174 may be merged with each other or remain separated from each other, and the source/drain regions 274 may be merged with each other or remain separated from each other. Also, the shapes of the epitaxy regions 172 and 272 may be similar to what is shown, or have other shapes such as spade/diamond shapes.

Figure 20:
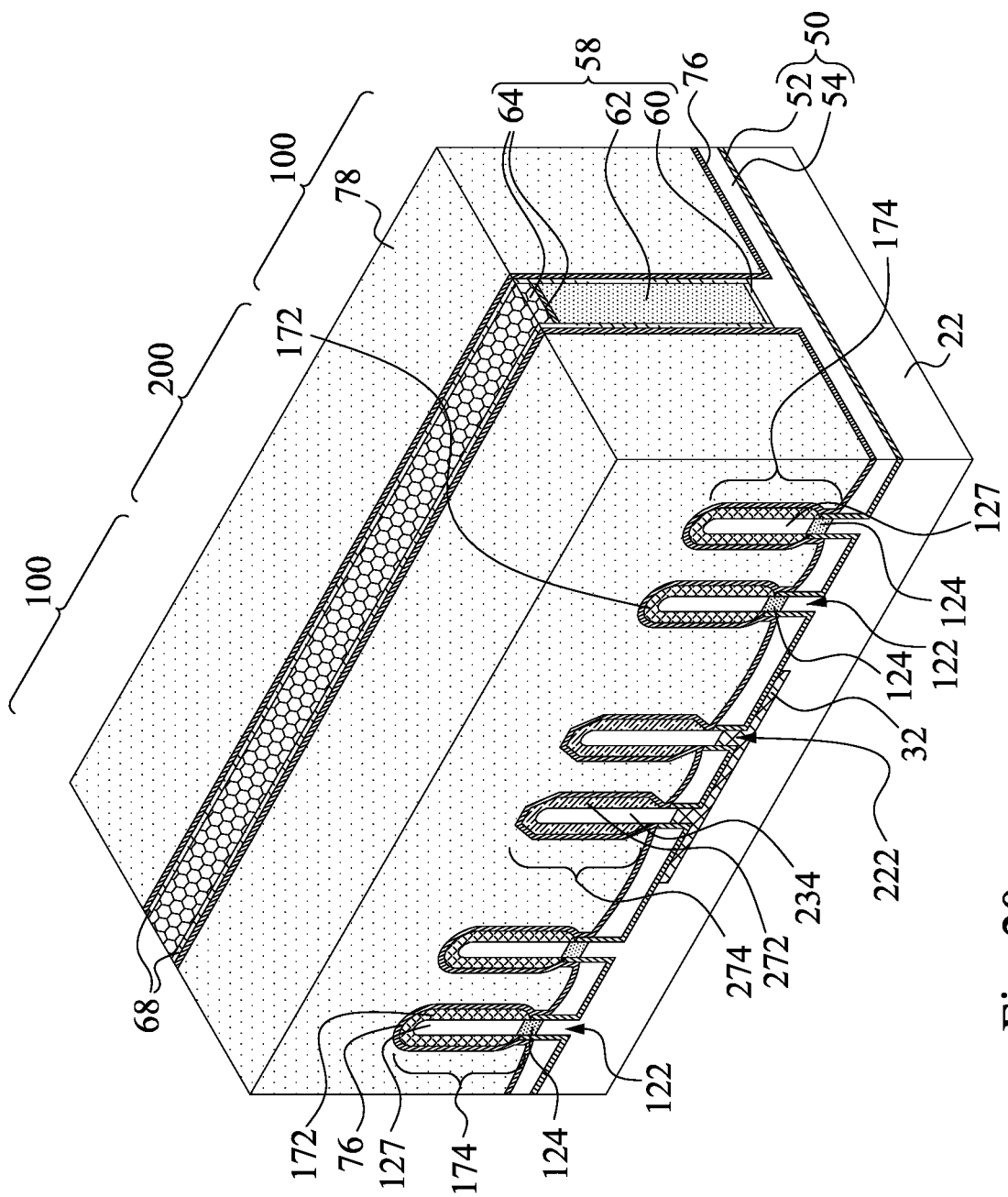

FIG. 20 illustrates a perspective view of the structure with a Contact Etch Stop Layer (CESL) 76 and an Inter-Layer Dielectric (ILD) 78 being formed. The CESL 76 may be formed of silicon nitride, silicon carbo-nitride, or the like. The CESL 76 may be formed using a conformal deposition method such as ALD, for example. The ILD 78 may include a dielectric material formed using, for example, FCVD, spin-on coating, CVD, or other deposition methods. The ILD 78 may also be formed of Tetra Ethyl Ortho Silicate (TEOS) oxide, Plasma Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as CMP or mechanical grinding may be performed to level the top surfaces of the ILD 78, the dummy gate stack 58, and the gate spacers 68 with each other.

Figure 21:
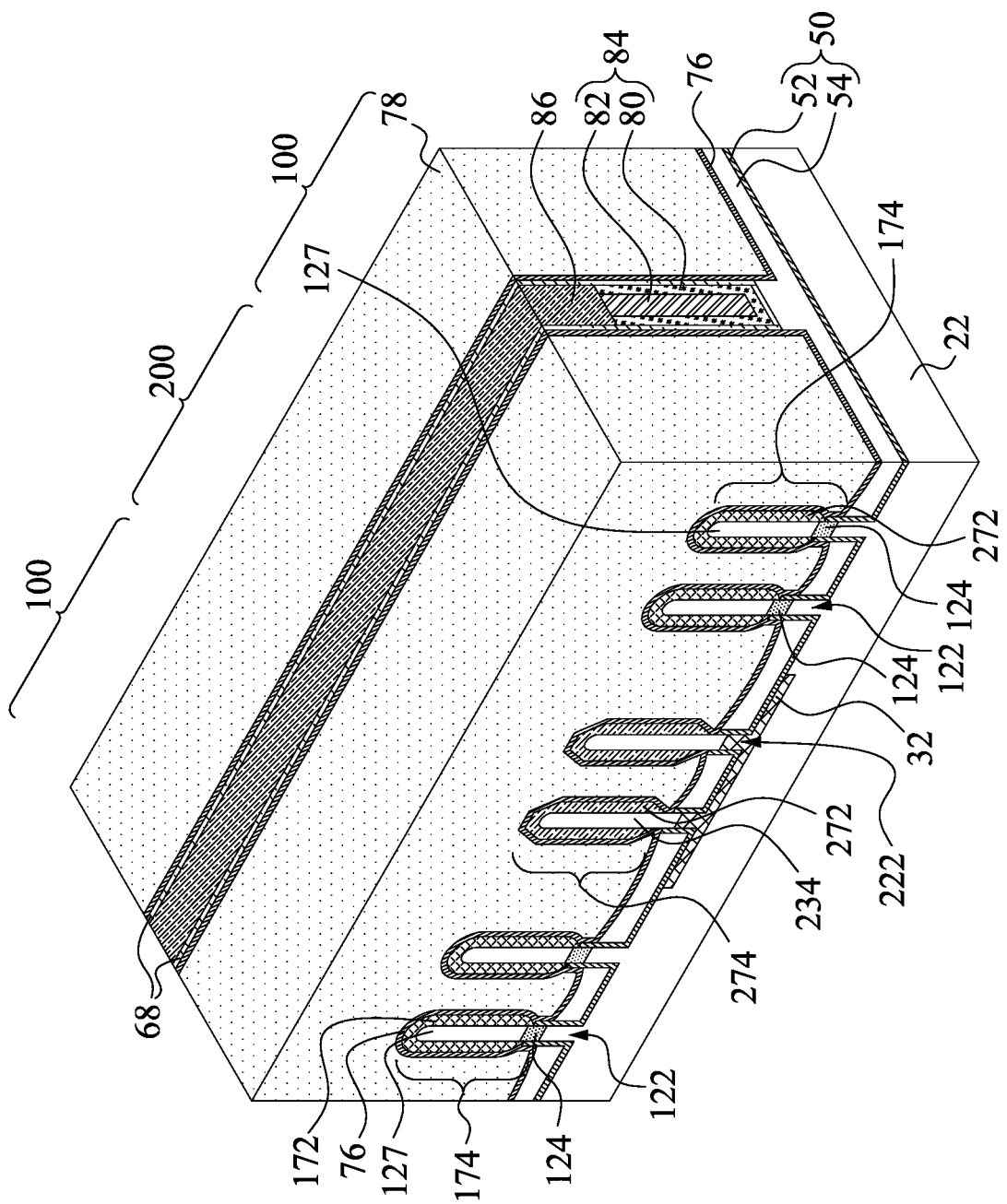

Next, the dummy gate stack 58, which includes the hard mask layer 64, the dummy gate electrode 62 and the dummy gate dielectric 60, is replaced with a replacement gate stack 84, which includes a gate electrode 82 and a replacement gate dielectric 80 as shown in FIG. 21.

When replacing the dummy gate stack 58, the hard mask layers 64, the dummy gate electrodes 62 and the dummy gate dielectrics 60 (FIG. 20) are first removed in one or a plurality of etching steps, resulting in a trench (opening) to be formed between the gate spacers 68. In the formation of the replacement gates, a gate dielectric 80 (FIG. 21) is first formed, which extends into the recess left by the removed dummy gate stack 58, and may have a portion extending over the ILD 78. In accordance with some embodiments of the present disclosure, the gate dielectric 80 includes an Interfacial Layer (IL, not shown separately) as its lower part. The IL may include an oxide layer such as a silicon oxide layer, which is formed through a chemical oxidation process or a deposition process. The gate dielectric 80 may also include a high-k dielectric layer formed over the IL. The high-k dielectric layer is formed as a conformal layer, and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer in the gate dielectric 80 is formed using ALD or CVD.

The gate electrode 82 is formed over the gate dielectric 80 and filling the remaining portion of the recess. The formation of the gate electrode 82 may include a plurality of deposition processes to deposit a plurality of conductive layers, and performing a planarization step to remove the excess portions of the conductive layers over the ILD 78. The deposition of the conductive layers may be performed using conformal deposition methods such as ALD or CVD.

The gate electrode 82 may include a diffusion barrier layer and a work-function layer (or a plurality of work-function layers) over the diffusion barrier layer. The diffusion barrier layer may be formed of titanium nitride (TiN), which may (or may not) be doped with silicon to form TiSiN. The work-function layer determines the work function of the gate, and includes at least one layer, or a plurality of layers formed of different materials. The specific material of the work-function layer is selected according to whether the respective FinFET is an n-type FinFET or a p-type FinFET.

For example, for the n-type FinFET in the n-type device region 100, the work-function layer may include a TaN layer and a titanium aluminum (TiAl) layer over the TaN layer. For the p-type FinFET in the p-type device region 200, the work-function layer may include a TaN layer, a TiN layer over the TaN layer, and a TiAl layer over the TiN layer. After the deposition of the work-function layer(s), another barrier layer, which may be another TiN layer, is formed. The gate electrode 82 may also include a filling metal, which may be formed of tungsten or cobalt, for example. After the formation of the replacement gate 84, the replacement gate 84 is etched back, and the dielectric hard mask 86 is formed over the etched-back replacement gate 84.

Figure 22:
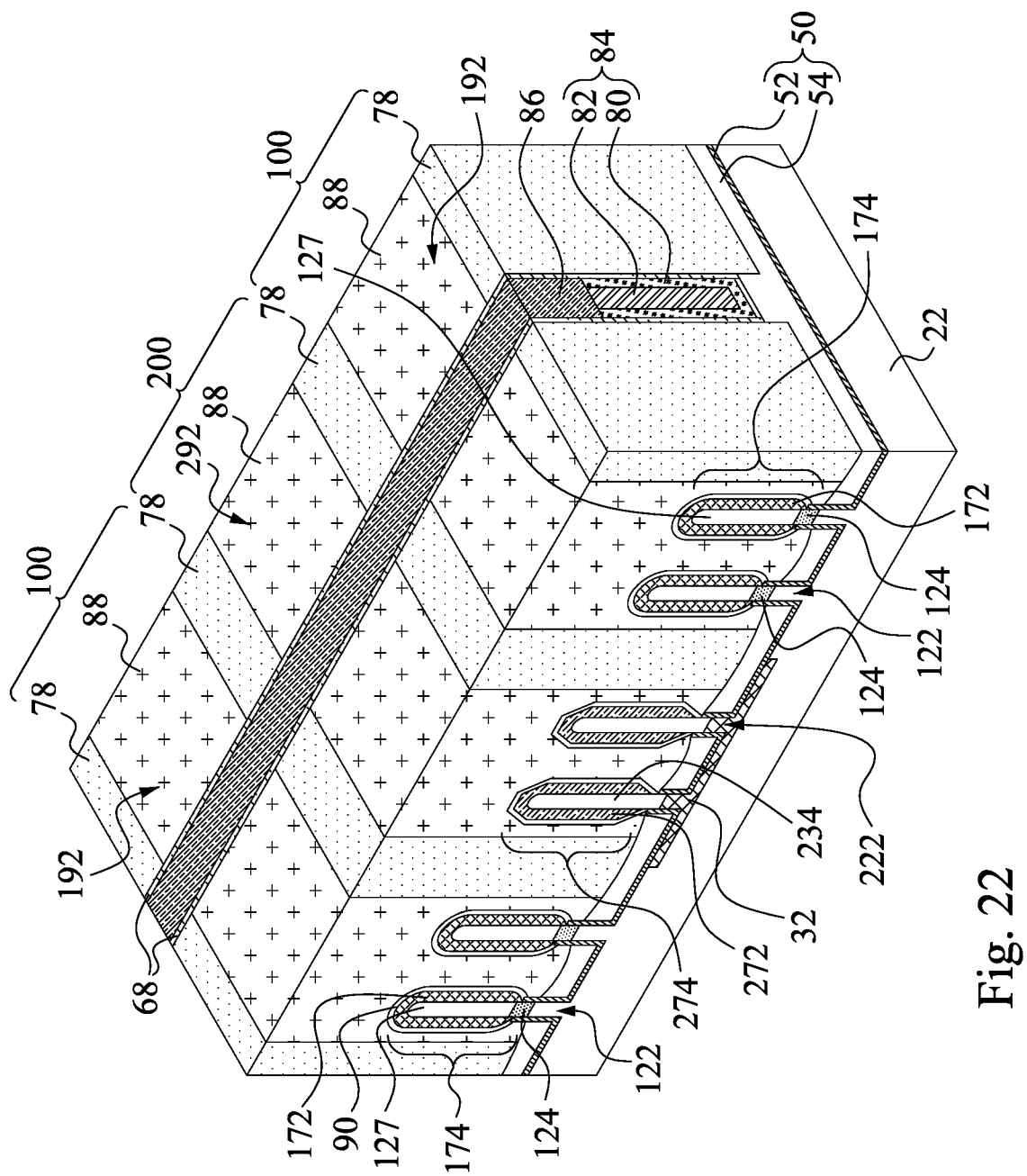

After the structure as shown in FIG. 21 is formed, the ILD 78 and the CESL 76 are etched to form contact openings. The etching may be performed using, for example, Reactive Ion Etching (RIE). In a subsequent step, as shown in FIG. 22, source/drain contact plugs 88 are formed. Before forming the contact plugs 88, the portions of the CESL 76 exposed to the contact openings are first etched, revealing the epitaxy regions 172 and 272. The silicide regions 90 are then formed on the epitaxy regions 172 and 272. In accordance with some embodiments of the present disclosure, the contact plugs 88 include barrier layers and a metal-containing material over the respective barrier layers. In accordance with some embodiments of the present disclosure, the formation of the contact plugs 88 includes forming a blanket barrier layer and a metal-containing material over the blanket barrier layer, and performing a planarization to remove excess portions of the blanket barrier layer and the metal-containing material. The barrier layer may be formed of a metal nitride such as titanium nitride or tantalum nitride. The metal-containing material may be formed of tungsten, cobalt, copper, or the like. An n-type FinFET 192 and a p-type FinFET 292 are thus formed.

Based on the above discussion, it can be seen that the present disclosure offers advantages. It is understood, however, that other embodiments may offer additional advantages, and not all advantages are necessarily disclosed herein, and moreover that no particular advantage is required for all embodiments. One advantage is that the spacer with a desired sidewall slanted angle can effectively suppress stacking fault defects in the SiGe epitaxy layer. Another advantage is that an anti-punch through (APT) layer can be epitaxially grown in the recess of the hybrid substrate, which in turn will prevent punch through of dopants from subsequently formed source/drain regions.

In some embodiments, a method includes etching a hybrid substrate to form a recess in the hybrid substrate, in which the hybrid substrate includes a first semiconductor layer, a dielectric layer over the first semiconductor layer, and a second semiconductor layer over the first semiconductor layer, in which after the etching, a top surface of the first semiconductor layer is exposed to the recess; forming a spacer on a sidewall of the recess, in which the spacer is slanted at a first angle relative to the top surface of the first semiconductor layer; reshaping the spacer such that the a first sidewall of the reshaped spacer is slanted at a second angle relative to the top surface of the first semiconductor layer, in which the second angle is greater than the first angle; and performing a first epitaxy process to grow an epitaxy semiconductor layer in the recess after reshaping the spacer.

In some embodiments, a method includes etching a hybrid substrate to form a recess, in which the recess penetrates through an upper semiconductor layer and a dielectric layer, with a top surface of a lower semiconductor layer underlying the dielectric layer exposed to the recess; performing a first epitaxy process to grow a first epitaxy layer in the recess; after performing the first epitaxy process, forming a spacer on a sidewall of the recess; performing a second epitaxy process to grow a second epitaxy layer from the first epitaxy layer; and performing a patterning step to form a first strip and a second strip, in which the first strip comprises a portion of the upper semiconductor layer, a portion of the dielectric layer, and a portion of the lower semiconductor layer, and the second strip comprises a portion of the first epitaxy layer and a portion of the second epitaxy layer.

In some embodiments, a semiconductor device includes a semiconductor layer, a silicon strip and a silicon germanium strip over the semiconductor layer and having different top surface orientations, the silicon germanium strip having a stacking fault defect density less than $100/cm^2$, an isolation region between the silicon strip and the silicon germanium strip, an n-type source/drain region over the silicon strip, and a p-type source/drain region over the silicon germanium strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor layer;
    a silicon strip and a silicon germanium strip over the semiconductor layer and having different top surface orientations, the silicon germanium strip having a stacking fault defect density less than $100/cm^2$, the silicon strip having a (110) top surface orientation, and the silicon germanium strip having a (100) top surface orientation;
    a shallow trench isolation (STI) region laterally between the silicon strip and the silicon germanium strip;
    n-type source/drain regions over the silicon strip; and
    p-type source/drain regions over the silicon germanium strip.

2. The semiconductor device of claim 1, further comprising:
    an anti-punch through layer between the silicon germanium strip and the semiconductor layer.

3. The semiconductor device of claim 2, wherein the anti-punch through layer has a surface orientation same as a surface orientation of the semiconductor layer.

4. The semiconductor device of claim 1, wherein a bottom surface of the silicon strip is higher than a bottom surface of the silicon germanium strip.

5. The semiconductor device of claim 1, further comprising:
    a dielectric strip under the silicon strip, wherein the dielectric strip has a top surface higher than a top surface of the STI region.

6. The semiconductor device of claim 1, wherein the STI region has a top surface higher than a bottom surface of the silicon germanium strip.

7. A semiconductor device, comprising:
    a substrate;
    a first silicon strip over the substrate;
    a silicon germanium strip over the substrate;
    a first dielectric strip under the first silicon strip, wherein the first dielectric strip and the first silicon strip have an interface higher than a bottom surface of the silicon germanium strip;
    a shallow trench isolation (STI) region laterally between the first silicon strip and the silicon germanium strip;
    first n-type source/drain regions wrapping the first silicon strip; and
    p-type source/drain regions wrapping the silicon germanium strip.

8. The semiconductor device of claim 7, wherein the STI region comprises a dielectric liner and a fill dielectric over the dielectric liner, and the dielectric liner is in contact with a sidewall of the first dielectric strip.

9. The semiconductor device of claim 8, wherein the dielectric liner is also in contact with a sidewall of the silicon germanium strip.

10. The semiconductor device of claim 8, wherein the dielectric liner has a top end lower than the interface between the first dielectric strip and the first silicon strip.

11. The semiconductor device of claim 7, further comprising:
    a second silicon strip over the substrate, the silicon germanium strip is arranged between the first silicon strip and the second silicon strip;
    a second dielectric strip under the second silicon strip, wherein the second dielectric strip and the second silicon strip have an interface higher than the bottom surface of the silicon germanium strip; and
    second n-type source/drain regions wrapping the second silicon strip.

12. The semiconductor device of claim 11, further comprising:
    a gate structure extending across the first silicon strip, the silicon germanium strip, and the second silicon strip.

13. A semiconductor device, comprising:
    a semiconductor substrate;
    a first silicon strip over the semiconductor substrate;
    a silicon germanium strip over the semiconductor substrate, wherein the silicon germanium strip and the semiconductor substrate have the same surface orientation;
    a shallow trench isolation (STI) region laterally between the first silicon strip and the silicon germanium strip, wherein the STI region comprises a dielectric liner and a fill dielectric over the dielectric liner, and a top surface of the fill dielectric is lower than a bottom surface of the first silicon strip;
    n-type source/drain regions surrounding the first silicon strip; and
    p-type source/drain regions surrounding the silicon germanium strip.

14. The semiconductor device of claim 13, wherein the silicon germanium strip and the semiconductor substrate each have a (100) top surface orientation.

15. The semiconductor device of claim 13, further comprising:
    a dielectric strip directly under the first silicon strip, wherein the dielectric strip has a top surface higher than the top surface of the fill dielectric.

16. The semiconductor device of claim 15, wherein the dielectric liner protrudes from the top surface of the fill dielectric.

17. The semiconductor device of claim 15, wherein the dielectric liner has a top end lower than a bottom surface of the silicon germanium strip.

18. The semiconductor device of claim 15, further comprising a second silicon strip directly under the dielectric strip, and the second silicon strip has a top surface lower than a top end of the dielectric liner.

19. The semiconductor device of claim 18, wherein the second silicon strip has a (100) top surface orientation.

20. The semiconductor device of claim 13, wherein the first silicon strip has a (110) top surface orientation.

\* \* \* \* \*